United States Patent
Zhou et al.

(10) Patent No.: US 12,171,125 B2
(45) Date of Patent: Dec. 17, 2024

(54) DISPLAY PANEL INCLUDING A PLURALITY OF REPEATING UNITS AND DISPLAY DEVICE INCLUDING THE DISPLAY PANEL

(71) Applicants: Chengdu BOE Optoelectronics Technology Co., Ltd., Chengdu (CN); BOE TECHNOLOGY GROUP CO., LTD., Beijing (CN)

(72) Inventors: Yang Zhou, Beijing (CN); Yupeng He, Beijing (CN); Xin Zhang, Beijing (CN); Huijuan Yang, Beijing (CN); Tinghua Shang, Beijing (CN); Yu Wang, Beijing (CN); Xiaofeng Jiang, Beijing (CN); Lu Bai, Beijing (CN); Hao Zhang, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 428 days.

(21) Appl. No.: 17/620,827

(22) PCT Filed: Oct. 20, 2020

(86) PCT No.: PCT/CN2020/122186
§ 371 (c)(1),
(2) Date: Dec. 20, 2021

(87) PCT Pub. No.: WO2022/082430
PCT Pub. Date: Apr. 28, 2022

(65) Prior Publication Data
US 2022/0416005 A1    Dec. 29, 2022

(51) Int. Cl.
*H01L 33/00*    (2010.01)
*G09G 3/3233*    (2016.01)
(Continued)

(52) U.S. Cl.
CPC ....... *H10K 59/1315* (2023.02); *G09G 3/3233* (2013.01); *G09G 2300/0426* (2013.01);
(Continued)

(58) Field of Classification Search
CPC ............ H10K 59/1315; H10K 59/351; H10K 59/80515; H10K 59/123; G09G 3/3233;
(Continued)

(56) References Cited

U.S. PATENT DOCUMENTS 10,734,460 B2    8/2020    Chu et al.
10,903,283 B2    1/2021    Choi
(Continued)

FOREIGN PATENT DOCUMENTS

CN    107808892 A    3/2018
CN    108428704 A    8/2018
(Continued)

OTHER PUBLICATIONS

International Search Report of PCT/CN2020/122186 in Chinese, mailed Jul. 22, 2021 with English translation.
(Continued)

*Primary Examiner* — Tan N Tran
(74) *Attorney, Agent, or Firm* — Collard & Roe, P.C.

(57) ABSTRACT

A display panel and a display device are provided. The display panel includes: a sub-pixel including a pixel circuit and a light-emitting element, the light-emitting element including a first electrode; a first insulating layer, the first electrode being connected with the pixel circuit through a first via hole penetrating the first insulating layer; a pixel definition layer including an opening; the first electrode includes a main body portion and a connecting portion, the main body portion is at least partially overlapped with the opening, the connecting portion is at least partially overlapped with the first via hole, a size of the connecting portion
(Continued)

at the first via hole in a first direction is ⅕ to ⅘ of a size of the main body portion in the first direction.

19 Claims, 13 Drawing Sheets

(51) Int. Cl.
 *H10K 59/131* (2023.01)
 *H10K 59/35* (2023.01)
(52) U.S. Cl.
 CPC ............... *G09G 2300/0452* (2013.01); *G09G 2300/0819* (2013.01); *G09G 2300/0842* (2013.01); *G09G 2300/0861* (2013.01); *H10K 59/351* (2023.02)
(58) Field of Classification Search
 CPC ... G09G 2300/0426; G09G 2300/0452; G09G 2300/0819; G09G 2300/0842; G09G 2300/0861
 USPC ...................................... 257/59, 72
 See application file for complete search history.

(56) References Cited

U.S. PATENT DOCUMENTS

| | | |
|---|---|---|
| 11,133,357 B2 | 9/2021 | Zeng et al. |
| 11,271,183 B2 | 3/2022 | Zeng et al. |
| 11,335,751 B2 | 5/2022 | Chen et al. |
| 2014/0292622 A1 | 10/2014 | Lee |
| 2015/0048322 A1 | 2/2015 | So et al. |
| 2015/0102320 A1 | 4/2015 | Jung |
| 2019/0140034 A1 | 5/2019 | Lee et al. |
| 2020/0144336 A1* | 5/2020 | Xiong .................. H10K 59/121 |

FOREIGN PATENT DOCUMENTS

| | | |
|---|---|---|
| CN | 109935616 A | 6/2019 |
| CN | 110046611 A | 7/2019 |
| CN | 110061042 A | 7/2019 |

OTHER PUBLICATIONS

Written Opinion of the International Searching Authority of PCT/CN2020/122186 in Chinese, mailed Jul. 22, 2021.

* cited by examiner

DISPLAY PANEL INCLUDING A PLURALITY OF REPEATING UNITS AND DISPLAY DEVICE INCLUDING THE DISPLAY PANEL

CROSS REFERENCE TO RELATED APPLICATIONS

This application is the National Stage of PCT/CN2020/122186 filed on Oct. 20, 2020, the disclosure of which is incorporated by reference.

TECHNICAL FIELD

Embodiments of the present disclosure relate to a display panel and a display device.

BACKGROUND

In recent years, the active-matrix organic light-emitting diode (AMOLED) display device has developed rapidly in the display field, and has been widely used. At the same time, the requirement of consumers on display effect of the display device has been higher and higher.

With the development of AMOLED display panel technology, the requirement on performance of the pixel circuit is increasing. Therefore, it is necessary to improve the pixel circuit structure of AMOLED so as to improve the luminous performance of pixels.

SUMMARY

Embodiments of the present disclosure provide a display panel and a display device.

At least one embodiment of the present disclosure provides a display panel, including: a base substrate; a sub-pixel, located on the base substrate, and including a pixel circuit and a light-emitting element connected with the pixel circuit, the light-emitting element including a first electrode; a first insulating layer, located at a side of the pixel circuit away from the base substrate, the first electrode being connected with the pixel circuit through a first via hole penetrating the first insulating layer; a pixel definition layer, located at a side of the first electrode away from the base substrate, and including an opening; the first electrode includes a main body portion and a connecting portion, the main body portion is connected with the pixel circuit through the connecting portion, an orthographic projection of the main body portion on the base substrate is at least partially overlapped with an orthographic projection of the opening on the base substrate, an orthographic projection of the connecting portion on the base substrate is at least partially overlapped with an orthographic projection of the first via hole on the base substrate, a size of the connecting portion at the first via hole in a first direction is ⅕ to ⅘ of a size of the main body portion in the first direction.

For example, according to the display panel provided by an embodiment of the present disclosure, the size of the connecting portion at the first via hole in the first direction is ⅓ to ¾ of the size of the main body portion in the first direction.

For example, according to the display panel provided by an embodiment of the present disclosure, the size of the connecting portion at the first via hole in the first direction is ½ to ¾ of the size of the main body portion in the first direction.

For example, according to the display panel provided by an embodiment of the present disclosure, a shape of the main body portion of the first electrode is same as a shape of the opening, and an area of the main body portion is greater than an area of the opening.

For example, according to the display panel provided by an embodiment of the present disclosure, the orthographic projection of the opening on the base substrate completely falls within the orthographic projection of the main body portion on the base substrate.

For example, according to the display panel provided by an embodiment of the present disclosure, the main body portion and the connecting portion are of an integral structure.

For example, according to the display panel provided by an embodiment of the present disclosure, a plurality of sub-pixels are provided, the plurality of sub-pixels includes a plurality of first color sub-pixels, a plurality of second color sub-pixel pairs, and a plurality of third color sub-pixels, and the plurality of first color sub-pixels, the plurality of second color sub-pixel pairs, and the plurality of third color sub-pixels are arranged as a plurality of repeating units, each of the plurality of repeating units includes one first color sub-pixel, one second color sub-pixel pair, and one third color sub-pixel which are sequentially arranged in the first direction, two second color sub-pixels included in the second color sub-pixel pair are arranged in a second direction, the plurality of repeating units are arranged in the first direction to form a plurality of repeating unit groups, the plurality of repeating unit groups are arranged in the second direction, and adjacent repeating unit groups among the plurality of repeating unit groups are staggered with each other in the first direction.

For example, according to the display panel provided by an embodiment of the present disclosure, the second color sub-pixel pair includes a first sub-pixel and a second sub-pixel, and in one repeating unit, a distance from the first via hole of the first sub-pixel to a line connecting a center of the first via hole of the first color sub-pixel and a center of the first via hole of the third color sub-pixel is less than a distance from the first via hole of the second sub-pixel to the line connecting the center of the first via hole of the first color sub-pixel and the center of the first via hole of the third color sub-pixel, a distance between a portion of the first electrode of the first color sub-pixel at a position of the first via hole and a portion of the first electrode of the first sub-pixel at a position of the first via hole is $D_1$, $D_1$ is less than or equal to 14 μm, and a distance between a portion of the first electrode of the third color sub-pixel at a position of the first via hole and a portion of the first electrode of the first sub-pixel at a position of the first via hole is $D_2$, and $D_2$ is less than or equal to 13 μm.

For example, according to the display panel provided by an embodiment of the present disclosure, a distance between a portion of the first electrode of the second sub-pixel at a position of the first via hole and a portion, at a position of the first via hole, of the first electrode of the third color sub-pixel in a repeating unit adjacent to the second sub-pixel, is $D_3$, $D_3$ is less than or equal to 12 μm, a distance between a portion of the first electrode of the second sub-pixel at a position of the first via hole and a portion, at a position of the first via hole, of the first electrode of the first color sub-pixel in a repeating unit adjacent to the second sub-pixel, is $D_4$, and $D_4$ is less than or equal to 10 μm.

For example, according to the display panel provided by an embodiment of the present disclosure, $D_1$ is in a range of 13-14 μm, $D_2$ is in a range of 12-13 μm, $D_3$ is in a range of 10.5-12 μm, and $D_4$ is in a range of 8.5-10 μm.

For example, according to the display panel provided by an embodiment of the present disclosure, a distance between a boundary of the first electrode and the first via hole is greater than or equal to 3 μm.

For example, according to the display panel provided by an embodiment of the present disclosure, the second color sub-pixel pair includes a first sub-pixel and a second sub-pixel, and in one repeating unit, a distance from the first via hole of the first sub-pixel to a line connecting a center of the first via hole of the first color sub-pixel and a center of the first via hole of the third color sub-pixel is less than a distance from the first via hole of the second sub-pixel to the line connecting the center of the first via hole of the first color sub-pixel and the center of the first via hole of the third color sub-pixel, a distance between a portion of the first electrode of the first color sub-pixel at a position of the first via hole and a portion of the first electrode of the first sub-pixel at a position of the first via hole is D1, a distance between a portion of the first electrode of the third color sub-pixel at a position of the first via hole and a portion of the first electrode of the first sub-pixel at a position of the first via hole is D2, a distance between a portion of the first electrode of the second sub-pixel at a position of the first via hole and a portion, at a position of the first via hole, of the first electrode of the third color sub-pixel in a repeating unit adjacent to the second sub-pixel, is D3, a distance between a portion of the first electrode of the second sub-pixel at a position of the first via hole and a portion, at a position of the first via hole, of the first electrode of the first color sub-pixel in a repeating unit adjacent to the second sub-pixel, is D4, D1 is greater than D2, and D3 is greater than D4.

For example, according to the display panel provided by an embodiment of the present disclosure, the second color sub-pixel pair includes a first sub-pixel and a second sub-pixel, and in one repeating unit, a distance from the first via hole of the first sub-pixel to a line connecting a center of the first via hole of the first color sub-pixel and a center of the first via hole of the third color sub-pixel is less than a distance from the first via hole of the second sub-pixel to the line connecting the center of the first via hole of the first color sub-pixel and the center of the first via hole of the third color sub-pixel, a distance between a portion of the first electrode of the first color sub-pixel at a position of the first via hole and a portion of the first electrode of the first sub-pixel at a position of the first via hole is D1, a distance between a portion of the first electrode of the third color sub-pixel at a position of the first via hole and a portion of the first electrode of the first sub-pixel at a position of the first via hole is D2, D1 is greater than a size of the connecting portion of the first sub-pixel at the first via hole in the first direction, and the size of the connecting portion of the first sub-pixel at the first via hole in the first direction is greater than D2.

For example, according to the display panel provided by an embodiment of the present disclosure, the second color sub-pixel pair includes a first sub-pixel and a second sub-pixel, and in one repeating unit, a distance from the first via hole of the first sub-pixel to a line connecting a center of the first via hole of the first color sub-pixel and a center of the first via hole of the third color sub-pixel is less than a distance from the first via hole of the second sub-pixel to the line connecting the center of the first via hole of the first color sub-pixel and the center of the first via hole of the third color sub-pixel, a distance between a portion of the first electrode of the second sub-pixel at a position of the first via hole and a portion, at a position of the first via hole, of the first electrode of the third color sub-pixel in a repeating unit adjacent to the second sub-pixel, is D3, a distance between a portion of the first electrode of the second sub-pixel at a position of the first via hole and a portion, at a position of the first via hole, of the first electrode of the first color sub-pixel in a repeating unit adjacent to the second sub-pixel, is D4, a size of the connecting portion of the second sub-pixel at the first via hole in the first direction is greater than D3, and D3 is greater than D4.

For example, according to the display panel provided by an embodiment of the present disclosure, the second color sub-pixel pair includes a first sub-pixel and a second sub-pixel, and in one repeating unit, a distance from the first via hole of the first sub-pixel to a line connecting a center of the first via hole of the first color sub-pixel and a center of the first via hole of the third color sub-pixel is less than a distance from the first via hole of the second sub-pixel to the line connecting the center of the first via hole of the first color sub-pixel and the center of the first via hole of the third color sub-pixel, a distance between a portion of the first electrode of the first color sub-pixel at a position of the first via hole and a portion of the first electrode of the first sub-pixel at a position of the first via hole is D1, a distance between a portion of the first electrode of the third color sub-pixel at a position of the first via hole and a portion of the first electrode of the first sub-pixel at a position of the first via hole is D2, and a sum of D1, a size of the connecting portion of the first sub-pixel at the first via hole in the first direction, and D2, is greater than a size of the main body portion of the first sub-pixel in the first direction.

For example, according to the display panel provided by an embodiment of the present disclosure, the second color sub-pixel pair includes a first sub-pixel and a second sub-pixel, and in one repeating unit, a distance from the first via hole of the first sub-pixel to a line connecting a center of the first via hole of the first color sub-pixel and a center of the first via hole of the third color sub-pixel is less than a distance from the first via hole of the second sub-pixel to the line connecting the center of the first via hole of the first color sub-pixel and the center of the first via hole of the third color sub-pixel, a distance between a portion of the first electrode of the second sub-pixel at a position of the first via hole and a portion, at a position of the first via hole, of the first electrode of the third color sub-pixel in a repeating unit adjacent to the second sub-pixel, is D3, a distance between a portion of the first electrode of the second sub-pixel at a position of the first via hole and a portion, at a position of the first via hole, of the first electrode of the first color sub-pixel in a repeating unit adjacent to the second sub-pixel, is D4, and a sum of D3, a size of the connecting portion of the second sub-pixel at the first via hole in the first direction, and D4, is greater than a size of the main body portion of the second sub-pixel in the first direction.

For example, according to the display panel provided by an embodiment of the present disclosure, the connecting portion has a connecting sub-portion located between the opening and the first via hole, and an average size of the connecting sub-portion in the first direction is greater than a maximum size of the opening in the first direction.

For example, according to the display panel provided by an embodiment of the present disclosure, a minimum size of the connecting sub-portion in the first direction is greater than the maximum size of the opening in the first direction.

For example, according to the display panel provided by an embodiment of the present disclosure, in the repeating unit, the connecting sub-portion of the first color sub-pixel is bent toward the second color sub-pixel pair with respect to the main body portion of the first color sub-pixel, and the connecting sub-portion of the third color sub-pixel is bent toward the second color sub-pixel pair with respect to the main body portion of the third color sub-pixel, the connecting sub-portion of the first color sub-pixel at least includes a size-gradual-change part, the size-gradual-change part of the first color sub-pixel is located between an edge of the connecting sub-portion of the first color sub-pixel away from the second color sub-pixel pair and the opening of the first color sub-pixel, and a size of the size-gradual-change part of the first color sub-pixel in a direction perpendicular to an extending direction of the size-gradual-change part of the first color sub-pixel gradually changes, and the connecting sub-portion of the third color sub-pixel at least includes a size-gradual-change part, the size-gradual-change part of the third color sub-pixel is located between an edge of the connecting sub-portion of the third color sub-pixel away from the second color sub-pixel pair and the opening of the third color sub-pixel, and a size of the size-gradual-change part of the third color sub-pixel in a direction perpendicular to an extending direction of the size-gradual-change part of the third color sub-pixel gradually changes.

For example, according to the display panel provided by an embodiment of the present disclosure, a size of the size-gradual-change part gradually increases in a direction from a position away from the first via hole to a position close to the first via hole.

For example, according to the display panel provided by an embodiment of the present disclosure, the connecting sub-portion has a first edge and a second edge which are opposite to each other, an included angle between the first edge and the second edge of the first electrode of the first color sub-pixel is greater than 0 and less than or equal to 17°, and an included angle between the first edge and the second edge of the first electrode of the third color sub-pixel is greater than 0 and less than or equal to 15°.

For example, according to the display panel provided by an embodiment of the present disclosure, an included angle between the first edge and the second edge of the first electrode of one of the two second color sub-pixels is greater than or equal to 0 and less than or equal to 60°, and an included angle between the first edge and the second edge of the first electrode of the other of the two second color sub-pixels is greater than or equal to 5° and less than or equal to 60°.

For example, according to the display panel provided by an embodiment of the present disclosure, in the first color sub-pixel, a size of the first via hole in the first direction is 40%-60% of a size of the opening in the first direction; in the second color sub-pixel, a size of the first via hole in the first direction is 30%-50% of a size of the opening in the first direction; and in the third color sub-pixel, a size of the first via hole in the first direction is 30%-50% of a size of the opening in the first direction.

For example, according to the display panel provided by an embodiment of the present disclosure, the first color sub-pixel is a red sub-pixel, the second color sub-pixel is a green sub-pixel, and the third color sub-pixel is a blue sub-pixel.

For example, according to the display panel provided by an embodiment of the present disclosure, the connecting sub-portion has a first edge and a second edge which are opposite to each other, the main body portion has a first side and a second side which are opposite to each other and parallel with each other, the first side is connected with the first edge, and the second side is connected with the second edge, a length of a line connecting a midpoint of the first edge and a midpoint of an edge of the opening closest to the first edge is greater than 5 μm, and a length of a line connecting a midpoint of the second edge and a midpoint of an edge of the opening closest to the second edge is greater than 5 μm.

For example, according to the display panel provided by an embodiment of the present disclosure, a size of the first via hole in the first direction is greater than a size of the first via hole in the second direction.

For example, according to the display panel provided by an embodiment of the present disclosure, the display panel further includes a second insulating layer located at a side of the pixel circuit away from the base substrate and a conductive connection element located at a side of the second insulating layer away from the base substrate, the conductive connection element is connected with the pixel circuit through a second via hole penetrating the second insulating layer, and the first electrode is connected with the pixel circuit through the conductive connection element.

For example, according to the display panel provided by an embodiment of the present disclosure, the light-emitting element further includes a light-emitting functional layer and a second electrode; the first electrode, the light-emitting functional layer, and the second electrode are sequentially stacked, and the second electrode is located at a side of the first electrode away from the base substrate.

For example, according to the display panel provided by an embodiment of the present disclosure, the pixel circuit includes a data writing transistor, a driving transistor, a storage capacitor, a threshold compensation transistor, a first light-emitting control transistor, a second light-emitting control transistor, a first reset transistor, and a second reset transistor; a first terminal of the data writing transistor is electrically connected with a first terminal of the driving transistor, a second terminal of the data writing transistor is electrically connected with a data line to receive a data signal, and a gate terminal of the data writing transistor is electrically connected with a scan signal line to receive a scan signal; a first terminal of the storage capacitor is electrically connected with a first power signal line, and a second terminal of the storage capacitor is electrically connected with a gate terminal of the driving transistor; a first terminal of the threshold compensation transistor is electrically connected with a second terminal of the driving transistor, a second terminal of the threshold compensation transistor is electrically connected with the gate terminal of the driving transistor, and a gate terminal of the threshold compensation transistor is electrically connected with the scan signal line to receive a compensation control signal; a first terminal of the first reset transistor is electrically connected with a reset power signal line to receive a first initialization signal, a second terminal of the first reset transistor is electrically connected with the gate terminal of the driving transistor, and a gate terminal of the first reset transistor is electrically connected with a reset control signal line to receive a first reset control signal; a first terminal of the second reset transistor is electrically connected with the reset power signal line to receive a second initialization signal, a second terminal of the second reset transistor is electrically connected with the first electrode of the light-emitting element, and a gate terminal of the second reset transistor is electrically connected with the reset control signal line to receive a second reset control signal; a first terminal of the first light-emitting control transistor is electrically connected with the first power signal line, a second terminal of the first light-emitting control transistor is electrically connected with the first terminal of the driving transistor, and a gate terminal of the first light-emitting control transistor is electrically connected with a light-emitting control signal line to receive a first light-emitting control signal; a first terminal of the second light-emitting control transistor is electrically connected with the second terminal of the driving transistor, a second terminal of the second light-emitting control transistor is electrically connected with the first electrode of the light-emitting element, and a gate terminal of the second light-emitting control transistor is electrically connected with the light-emitting control signal line to receive a second light-emitting control signal.

For example, according to the display panel provided by an embodiment of the present disclosure, the first direction is an extending direction of the scan signal line.

At least one embodiment of the present disclosure further provides a display device, including any one of the display panel as described above.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not construed as any limitation to the present disclosure.

DETAILED DESCRIPTION

In order to make objectives, technical details and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

Figure 1:
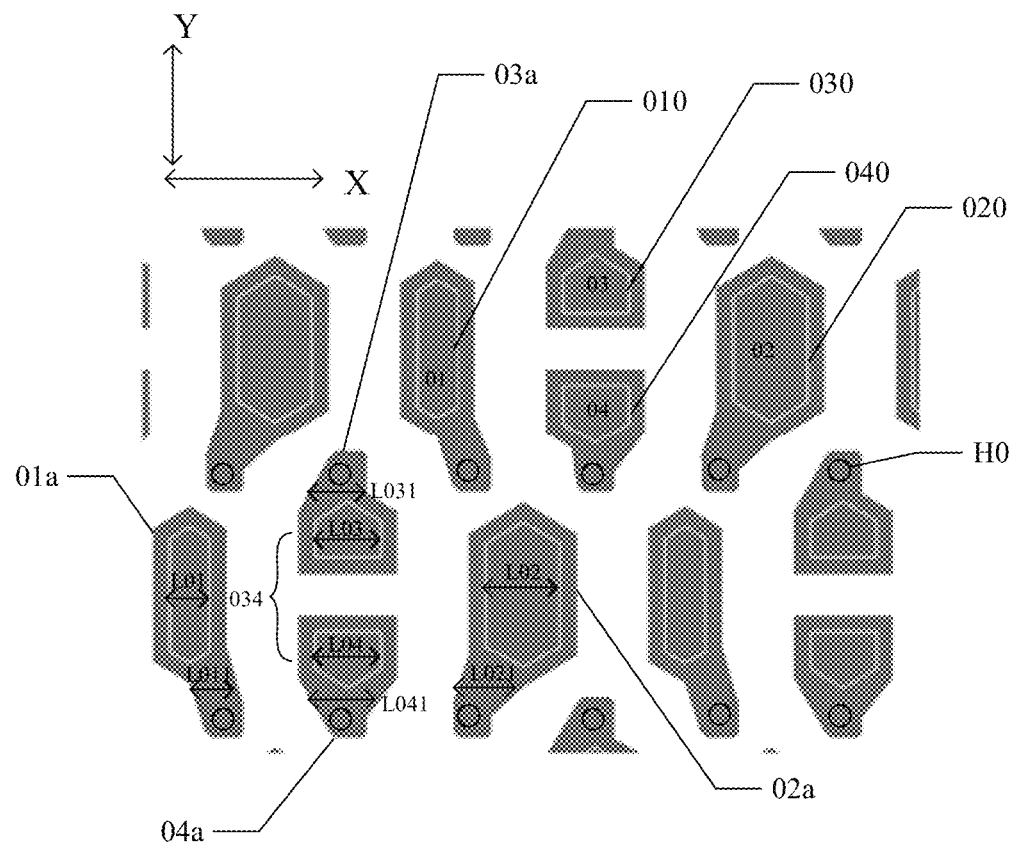
FIG. 1 is a plan view of a display panel.

FIG. 1 is a plan view of a display panel. As illustrated in FIG. 1, the display panel includes a red sub-pixel 01, a blue sub-pixel 02, a green sub-pixel 03, and a green sub-pixel 04, and the green sub-pixel 03 and the green sub-pixel 04 form a green sub-pixel pair 034. Each sub-pixel includes a pixel definition layer, the pixel definition layer includes an opening, and the opening can be a light-emitting region of the sub-pixel. As illustrated in FIG. 1, the red sub-pixel 01 includes an opening 010, the blue sub-pixel 02 includes an opening 020, the green sub-pixel 03 includes an opening 030, and the green sub-pixel 04 includes an opening 040. In FIG. 1, the pixel definition layer is illustrated in the form of an opening, and other parts of the pixel definition layer other than the opening are not illustrated. FIG. 1 illustrates a first direction X and a second direction Y, the first direction X can be a row direction and the second direction Y can be a column direction. As illustrated in FIG. 1, each sub-pixel further includes an anode, the red sub-pixel 01 includes an anode 01*a*, the blue sub-pixel 02 includes an anode 02*a*, the green sub-pixel 03 includes an anode 03*a*, and the green sub-pixel 04 includes an anode 04*a*. An electroluminescence (EL) material is arranged on the anode O1a. Because the EL material is deposited on the anode to form a light-emitting functional layer in the pixel circuit of AMOLED, the structure and performance of the anode will directly affect the luminescent performance of the EL material, and further affect the display effect of the entire display panel. For example, the EL material includes an organic EL material. For example, a cathode is provided at a side of the light-emitting functional layer away from the anode.

As illustrated in FIG. 1, each sub-pixel further includes a via hole H0, and the anode can be connected with a conductive element located below the anode through the via hole H0. For example, the via hole H0 can be a via hole penetrating a first insulating layer.

As illustrated in FIG. 1, for any one of the red sub-pixel 01, the blue sub-pixel 02, the green sub-pixel 03, and the green sub-pixel 04, the size of a portion of the anode located at the via hole H0 in the first direction is less than one third of the size of a portion of the anode located at the opening in the first direction.

As illustrated in FIG. 1, for any one of the red sub-pixel 01, the blue sub-pixel 02, the green sub-pixel 03, and the green sub-pixel 04, the average size of a portion of the anode located between the opening and the via hole H0 in the first direction X is less than the average size of the opening in the first direction X. As illustrated in FIG. 1, the size L011 is less than the size L01, the size L021 is less than the size L02, the size L031 is less than the size L03, and the size L041 is less than the size L04.

Figure 2:
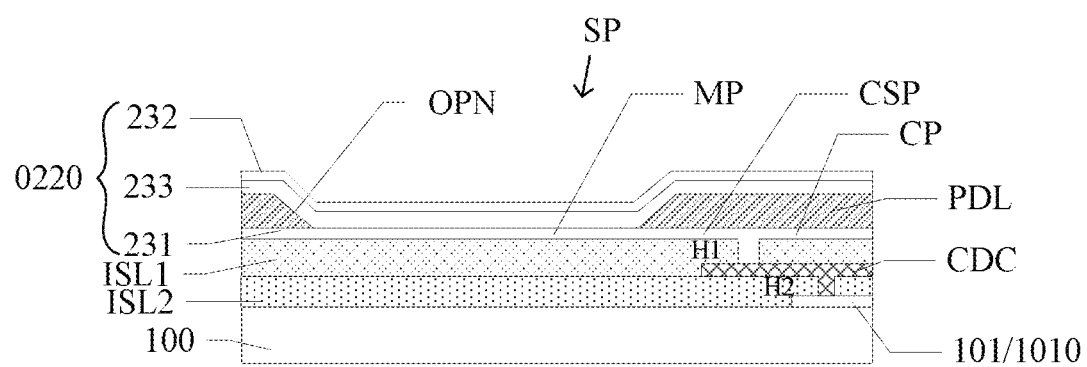
FIG. 2 is a partial cross-sectional structural view of a display substrate provided by an embodiment of the present disclosure.

FIG. 2 is a partial cross-sectional structural view of a display substrate provided by an embodiment of the present disclosure. As illustrated in FIG. 2, the display panel includes a base substrate 100, a sub-pixel SP, a first insulating layer ISL1, and a pixel definition layer PDL. The sub-pixel SP is located on the base substrate 100, and includes a pixel circuit 101 and a light-emitting element 0220 connected with the pixel circuit 101; the light-emitting element 0220 includes a first electrode 231, a light-emitting functional layer 233, and a second electrode 232 which are sequentially stacked, and the second electrode 232 is located at a side of the first electrode 231 away from the base substrate 100. The first insulating layer ISL1 is located at a side of the pixel circuit 101 away from the base substrate 100, and the first electrode 231 is connected with the pixel circuit 101 through a first via hole H1 penetrating the first insulating layer ISL1. The pixel definition layer PDL is located at a side of the first electrode 231 away from the base substrate 100, and includes an opening OPN. For example, the display panel can be an AMOLED display panel. For example, the light-emitting element 0220 includes an organic light-emitting element, but is not limited thereto.

As illustrated in FIG. 2, the first insulating layer ISL1 in the display substrate includes a via hole H1, so that the first electrode 231 can be electrically connected with the pixel circuit 101. The pixel definition layer PDL includes an opening OPN, so as to expose a part of the first electrode 231, and in the case where a subsequent light-emitting functional layer 233 is formed in the opening OPN, the light-emitting functional layer 233 is in contact with the first electrode 231, so as to form a light-emitting region.

For example, the orthographic projection of the opening of the pixel definition layer on the base substrate is located within the orthographic projection of the main body portion of a corresponding first electrode on the base substrate. That is, the orthographic projections of the main body portion of the first electrode and the opening of the pixel definition layer on the base substrate are at least partially overlapped with each other.

For example, the orthographic projection of the opening of the pixel definition layer on the base substrate is located within the orthographic projection of a corresponding light-emitting functional layer on the base substrate, that is, the light-emitting functional layer covers the opening of the pixel definition layer. For example, the area of the light-emitting functional layer is greater than the area of the corresponding opening of the pixel definition layer, that is, the light-emitting functional layer includes at least a part covering the concrete structure of the pixel definition layer besides a part located in the opening of the pixel definition layer. Generally, the light-emitting functional layer covers the concrete structure of the pixel definition layer at each boundary of the opening of the pixel definition layer. It should be noted that the above description of a pattern of the light-emitting functional layer is based on the organic light-emitting functional layer of each sub-pixel which is patterned by, for example, fine metal mask (FMM) process. In addition to the FMM manufacturing process, some light-emitting functional layers are an entire film layer formed in the entire display region by using an open mask process, and the orthographic projection of the shape thereof on the base substrate is continuous, so there must be a part located in the opening of the pixel definition layer and a part located on the concrete structure of the pixel definition layer. The concrete structure of the pixel define layer is the part of the pixel define layer other than the opening.

For example, as illustrated in FIG. 2, the display panel further includes a second insulating layer ISL2 located at a side of the pixel circuit 101 away from the base substrate 100 and a conductive connection element CDC located at a side of the second insulating layer ISL2 away from the base substrate 100; and the conductive connection element CDC is connected with the pixel circuit 101 through a second via hole H2 penetrating the second insulating layer ISL2, that is, the first electrode 231 is connected with the pixel circuit 101 through the conductive connection element CDC.

Figure 3:
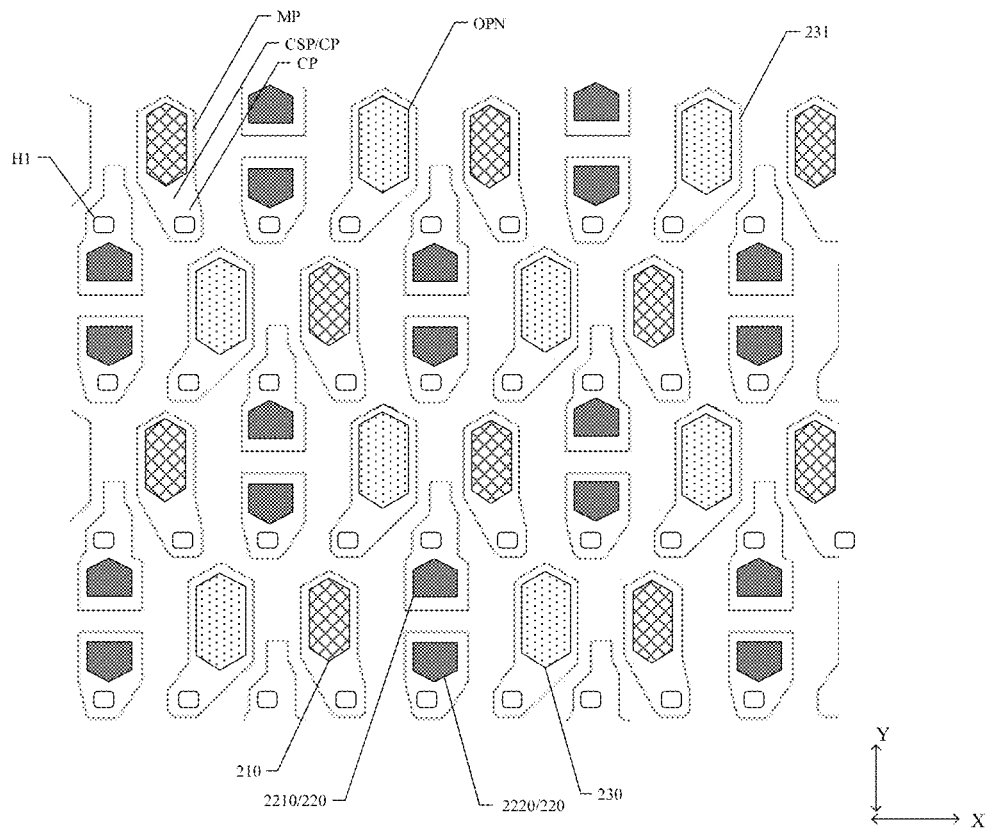
FIG. 3 is a partial plan view of a display panel provided by an embodiment of the present disclosure.
Figure 4:
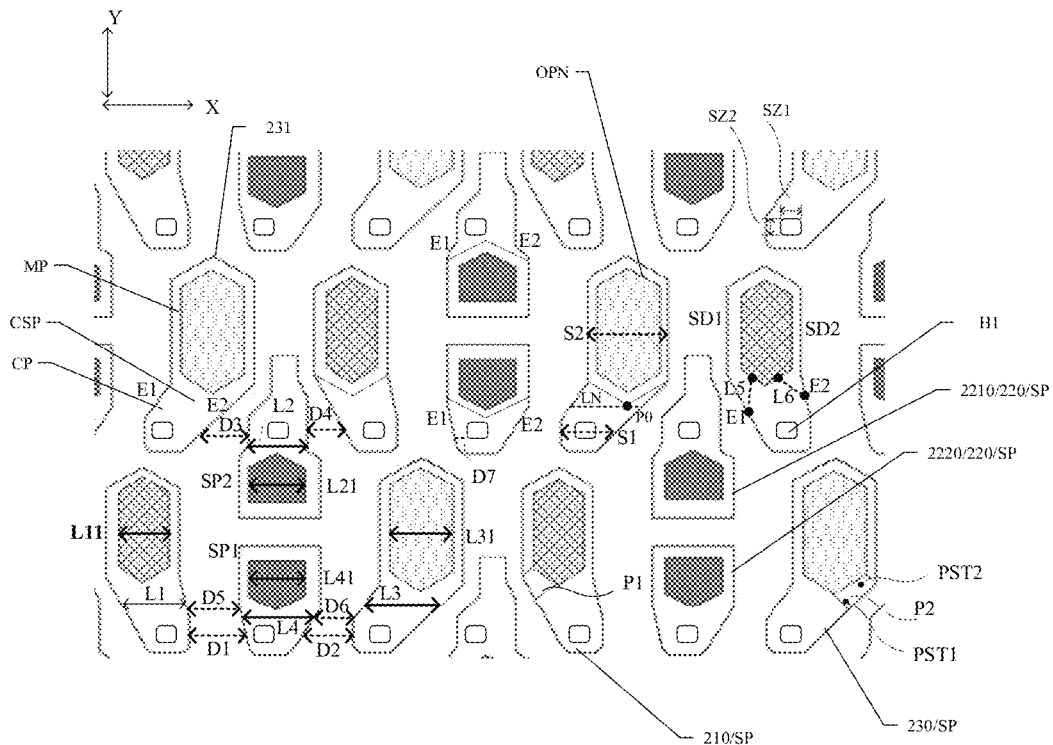
FIG. 4 is a partial view of FIG. 3.
Figure 5:
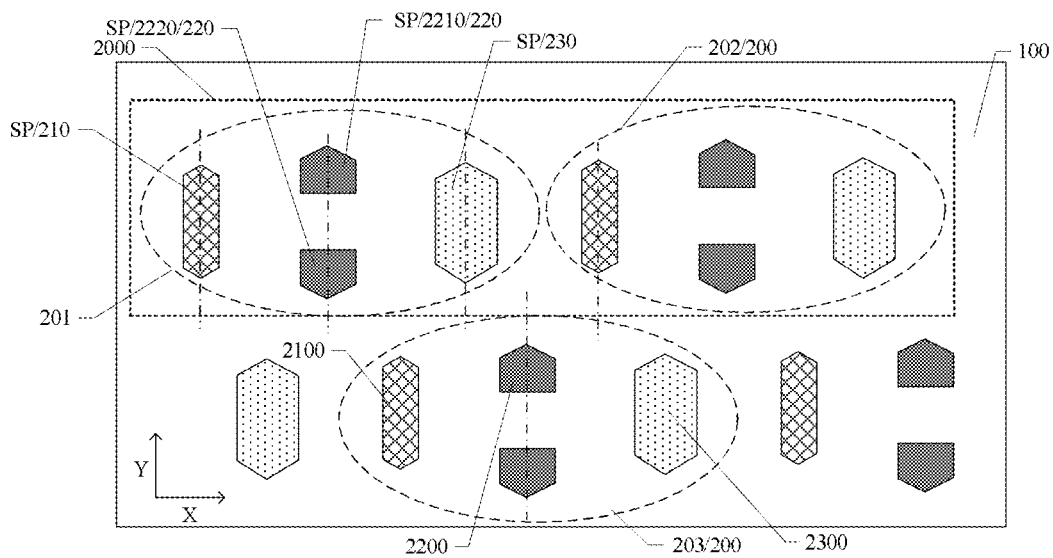
FIG. 5 is a schematic diagram of pixel arrangement of a display panel provided by an embodiment of the present disclosure.

FIG. 3 is a partial plan view of a display panel provided by an embodiment of the present disclosure. FIG. 4 is a partial view of FIG. 3. FIG. 5 is a schematic diagram of pixel arrangement of a display panel provided by an embodiment of the present disclosure. FIG. 3 and FIG. 4 illustrate a plurality of sub-pixels SP. FIG. 2 can be a partial cross-sectional view of one sub-pixel in FIG. 3.

FIG. 3 illustrates a first electrode and a first via hole H1 of a sub-pixel. As illustrated in FIG. 2 and FIG. 3, the first electrode 231 includes a main body portion MP and a connecting portion CP, and the main body portion MP is connected with the pixel circuit 101 through the connecting portion CP. The orthographic projection of the main body portion MP on the base substrate 100 is at least partially overlapped with the orthographic projection of the opening OPN on the base substrate 100, and the orthographic projection of the connecting portion CP on the base substrate 100 is at least partially overlapped with the orthographic projection of the first via hole H1 on the base substrate 100; the size S1 of the first electrode 231 at the first via hole H1 in the first direction X is ⅕ to ⅘ of the size S2 of the main body portion MP in the first direction X. For example, the size of the connecting portion CP at the first via hole H1 in the first direction X is ⅕ to ⅘ of the size of the main body portion MP in the first direction X. And further, for example, the size of the connecting portion CP at the first via hole H1 in the first direction X is ⅓ to ¾ of the size of the main body portion MP in the first direction X.

For example, the size of the first electrode 231 at the first via hole H1 in the first direction X corresponds to the size of the connecting portion CP at the first via hole H1 in the first direction X. For example, the size of the first electrode 231 at the first via hole H1 in the first direction X can refer to the size of the first electrode 231 at the geometric center of the first via hole H1 in the first direction X, but is not limited thereto. In some embodiments, the size of the first electrode 231 at the first via hole H1 in the first direction X can refer to the size of the first electrode 231 at the edge of the first via hole H1 in the first direction X.

For example, the size of the main body portion MP in the first direction X can refer to the maximum size of the main body portion MP in the first direction X.

In the display panel provided by the embodiment of the present disclosure, compared with a general design, the connecting portion CP is designed to be widened in the first direction X. That is, the size (width) of the connecting portion CP in the first direction X is greater than the width at this position in a general display panel; and compared with the general display panel, the planar shape of the first electrode of the light-emitting element in the display panel provided by the embodiment of the present disclosure is adjusted. The embodiments of the present disclosure, by adjusting the shape of the first electrode of the light-emitting element, minimize the loading of video/data signals caused by the resistance of the first electrode of the light-emitting element, thereby improving luminous performance of pixels and further improving the display effect of the display panel.

For example, in order to further improve the display effect, the size S1 of the first electrode 231 (the connecting portion CP) at the first via hole H1 in the first direction X is ½ to ¾ of the size S2 of the main body portion MP in the first direction X.

For example, as illustrated in FIG. 3, the connecting portion CP has a connecting sub-portion CSP located between the opening OPN and the first via hole H1, and the average size of the connecting sub-portion CSP in the first direction X is greater than the maximum size of the opening OPN in the first direction X. For example, the average size of the connecting sub-portion CSP in the first direction X can refer to the average value of the maximum size and the minimum size of the connecting sub-portion CSP in the first direction X, but is not limited thereto. For example, the average size of the connecting sub-portion CSP in the first direction X can refer to the size, in the first direction X, of the connecting sub-portion CSP at the position passing through the midpoint at the maximum length position in the second direction Y, but is not limited thereto. For example, the average size of the connecting sub-portion CSP in the first direction X can refer to the size, in the first direction X, of the connecting sub-portion CSP at the position passing through the midpoint of the line connecting the edge of the opening OPN close to the first via hole H1 and the edge of the first via hole H1 close to the opening OPN, but is not limited thereto. For example, the average size of the connecting sub-portion CSP in the first direction X can refer to the size, in the first direction X, of the connecting sub-portion CSP at the position passing through the center of gravity of the connecting sub-portion CSP. For example, the first direction X is the extending direction of a scan signal line. For example, the second direction Y is the extending direction of a data line.

In the display panel provided by the embodiment of the present disclosure, compared with a general design, the connecting sub-portion CSP is designed to be widened in the first direction X. That is, the size (width) of the connecting sub-portion CSP in the first direction X is greater than the width at this position in a general display panel; and compared with the general display panel, the planar shape of the first electrode of the light-emitting element in the display panel provided by the embodiment of the present disclosure is adjusted.

For example, the embodiments of the present disclosure, by adjusting the shape of the first electrode of the light-emitting element, minimize the loading of video/data signals caused by the resistance of the first electrode of the light-emitting element, thereby improving luminous performance of pixels and further improving the display effect of the display panel.

For example, as illustrated in FIG. 5, the display panel includes a base substrate 100 and a plurality of sub-pixels SP located on the base substrate 100, the plurality of sub-pixels SP include a plurality of first color sub-pixels 210, a plurality of second color sub-pixel pairs 220, and a plurality of third color sub-pixels 230; and the plurality of first color sub-pixels 210, the plurality of second color sub-pixel pairs 220, and the plurality of third color sub-pixels 230 are arranged as a plurality of repeating units 200. Each repeating unit 200 includes one first color sub-pixel 210, one second color sub-pixel pair 220, and one third color sub-pixel 230 which are sequentially arranged in the first direction X, two second color sub-pixels 2210 and 2220 included in the second color sub-pixel pair 220 are arranged in the second direction Y, the plurality of repeating units 200 are arranged in the first direction X to form a plurality of repeating unit groups 2000, the plurality of repeating unit groups 2000 are arranged in the second direction Y, and adjacent repeating unit groups among the plurality of repeating unit groups 2000 are staggered with each other in the first direction X. That is, adjacent repeating unit groups 2000 have a certain shift in the first direction X. Therefore, sub-pixels of the same color in adjacent repeating unit groups 2000 are not aligned in the second direction Y. The odd-row repeating unit groups 2000 have the same pixel arrangement manner, and the even-row repeating unit groups 2000 have the same pixel arrangement manner.

For example, the first color sub-pixel 210 is a red sub-pixel, the second color sub-pixel 2210 and the second color sub-pixel 2220 are green sub-pixels, the third color sub-pixel 230 is a blue sub-pixel, and the embodiment is not limited to this case.

For example, as illustrated in FIG. 4, the second color sub-pixel pair includes a first sub-pixel SP1 and a second sub-pixel SP2; and in one repeating unit, the distance from the first via hole H1 of the first sub-pixel SP1 to the line connecting a center of the first via hole H1 of the first color sub-pixel 210 and a center of the first via hole H1 of the third color sub-pixel 230 is less than the distance from the first via hole H1 of the second sub-pixel SP2 to the line connecting the center of the first via hole H1 of the first color sub-pixel 210 and the center of the first via hole H1 of the third color sub-pixel 230, the distance between a portion of the first electrode 231 of the first color sub-pixel 210 at the position of the first via hole H1 and a portion of the first electrode 231 of the first sub-pixel SP1 at the position of the first via hole H1 is D1, and the distance between a portion of the first electrode 231 of the third color sub-pixel 230 at the position of the first via hole H1 and a portion of the first electrode 231 of the first sub-pixel SP1 at the position of the first via hole H1 is D2.

For example, D1 is less than or equal to 14 μm, and D2 is less than or equal to 13 μm.

For example, the distance between a portion of the first electrode 231 of the second sub-pixel SP2 at the position of the first via hole H1 and a portion, at the position of the first via hole H1, of the first electrode 231 of the third color sub-pixel 230 in a repeating unit adjacent to the second sub-pixel SP2, is D3, and the distance between a portion of the first electrode 231 of the second sub-pixel SP2 at the position of the first via hole H1 and a portion, at the position of the first via hole H1, of the first electrode 231 of the first color sub-pixel 210 in a repeating unit adjacent to the second sub-pixel SP2, is D4.

For example, D3 is less than or equal to 12 μm, and D4 is less than or equal to 10 μm.

For example, D1 is in the range of 13-14 μm, D2 is in the range of 12-13 μm, D3 is in the range of 10.5-12 μm, and D4 is in the range of 8.5-10 μm.

For example, in some embodiments, D1 is 13 μm, D2 is 10 μm, D3 is 7.5 μm, and D4 is 7 μm.

For example, as illustrated in FIG. 4, in some embodiments, D1 is greater than D2, and D3 is greater than D4.

For example, as illustrated in FIG. 4, in some embodiments, D1 is greater than the size S1 of the connecting portion CP of the first sub-pixel SP1 at the first via hole H1 in the first direction X, and the size S1 of the connecting portion CP of the first sub-pixel SP1 at the first via hole H1 in the first direction X is greater than D2.

For example, as illustrated in FIG. 4, in some embodiments, the size S1 of the connecting portion CP of the second sub-pixel SP2 at the first via hole H1 in the first direction X is greater than D3, and D3 is greater than D4.

For example, as illustrated in FIG. 4, in some embodiments, the sum of D1, the size S1 of the connecting portion CP of the first sub-pixel SP1 at the first via hole H1 in the first direction X, and D2, is greater than the size S2 of the main body portion MP of the first sub-pixel SP1 in the first direction X.

For example, as illustrated in FIG. 4, in some embodiments, the sum of D3, the size S1 of the connecting portion CP of the second sub-pixel SP2 at the first via hole H1 in the first direction X, and D4, is greater than the size S2 of the main body portion MP of the second sub-pixel SP2 in the first direction X.

In the embodiment of the present disclosure, due to the adjustment of the shape of the first electrode 231, the values of D1-D4 are less than those in the conventional technology.

For example, as illustrated in FIG. 4, the distance D7 between the boundary of the first electrode 231 and the first via hole H1 is greater than or equal to 3 μm. In the embodiment of the present disclosure, due to the adjustment of the shape of the first electrode 231, the value of D7 is different from that in the conventional technology.

As illustrated in FIG. 4, for the first color sub-pixel 210, the average size L1 of the connecting sub-portion CSP in the first direction X is greater than the maximum size L11 of the opening OPN in the first direction X; for the third color sub-pixel 230, the average size L3 of the connecting sub-portion CSP in the first direction X is greater than the maximum size L31 of the opening OPN in the first direction X; for the second color sub-pixel 2210, the average size L2 of the connecting sub-portion CSP in the first direction X is greater than the maximum size L21 of the opening OPN in the first direction X; and for the second color sub-pixel 2220, the average size L4 of the connecting sub-portion CSP in the first direction X is greater than the maximum size L41 of the opening OPN in the first direction X.

For example, as illustrated in FIG. 4, the minimum size of the connecting sub-portion CSP in the first direction X is greater than the maximum size of the opening OPN in the first direction X. As illustrated in FIG. 4, for each of the first color sub-pixel 210, the second color sub-pixel 2210, the second color sub-pixel 2220, and the third color sub-pixel 230, the minimum size of the connecting sub-portion CSP in the first direction X is greater than the maximum size of the opening OPN in the first direction X. For example, the minimum size of the connecting sub-portion CSP in the first direction X can be the size, in the first direction X, of the connecting sub-portion CSP at the edge of the first via hole H1 close to the opening OPN.

For example, as illustrated in FIG. 4, the shape of the main body portion MP of the first electrode 231 is the same as the shape of the opening OPN, and the area of the main body portion MP is greater than the area of the opening OPN. For example, as illustrated in FIG. 4, the orthographic projection of the opening OPN on the base substrate completely falls within the range of the orthographic projection of the main body portion MP on the base substrate. In FIG. 4, the boundary between the main body portion MP and the connecting portion CP is outlined by dashed line. For example, the main body portion MP of the first electrode 231 can be formed by enlarging the opening OPN in scale. Of course, the main body portion MP and the connecting portion CP can also be divided in other ways, without being limited in the embodiment of the present disclosure. As illustrated in FIG. 4, in the case where the main body portion MP of the first electrode 231 is formed by enlarging the opening OPN in scale, the connecting portion CP forms a concave shape at the dashed line. In this case, the main body portion MP has a regular shape, and the connecting portion CP has an irregular shape. In the case where the connecting portion CP has an irregular shape, the size of the connecting portion CP in the first direction can still refer to the above listed cases. Of course, as illustrated in FIG. 4, the size, in the first direction X, of the connecting sub-portion CSP at the position passing through the middle point P0 of the concave shape can also be taken as the average size of the connecting sub-portion CSP in the first direction X, as illustrated by the dashed line LN in FIG. 4.

For example, for the first sub-pixel SP1 and the second color sub-pixel 220, the distance between the connecting sub-portions CSP is D5, and for example, D5 is less than or equal to 13 μm. In one embodiment, D5 is 12.6 μm. For example, D5 is less than D1.

For example, for the first sub-pixel SP1 and the first color sub-pixel 210, the distance between the connecting sub-portions CSP is D6, and for example, D6 is less than or equal to 10 μm. In one embodiment, D6 is 7.1 μm. For example, D6 is less than D2.

For example, as illustrated in FIG. 4, the main body portion MP and the connecting portion CP are of an integral structure. An integrated structure refers to that they are connected to each other and located in the same layer. For example, the main body portion MP and the connecting portion CP are formed of the same film layer by the same patterning process.

For example, as illustrated in FIG. 5, the shift between adjacent repeating unit groups 2000 in the first direction X is approximately half of the size of the repeating unit 200 in the first direction X. For example, the size of the repeating unit 200 in the first direction X is the pitch of the repeating unit 200 in the first direction X. Here, the pitch refers to the distance between the centers of the light-emitting regions of two first color sub-pixels 210 in two adjacent repeating units 200 in the first direction X, where the center of the light-emitting region refers to the geometric center of the planar shape of the light-emitting region.

For example, the first direction X and the second direction Y are two directions perpendicular to each other in the same plane. For example, the plane is a plane where pixels are arranged. The repeating unit here only refers to the repetition of sub-pixels, and other structures may be different or the same. In addition, the above repetition refers to that the positions, shapes, or sizes are approximately the same. In some cases, for wiring or opening needs, the shape may be slightly different, and for example, openings are disposed at different positions.

As illustrated in FIG. 5, two repeating units 200 located in the same repeating unit group 2000 and adjacent to each other include a first repeating unit 201 and a second repeating unit 202. The third color sub-pixel 230 of the first repeating unit 201 is adjacent to the first color sub-pixel 210 of the second repeating unit 202, a repeating unit 200 adjacent to both the first repeating unit 201 and the second repeating unit 202 and located in an adjacent repeating unit group 2000 is a third repeating unit 203. That "a repeating unit 200 adjacent to both the first repeating unit 201 and the second repeating unit 202 and located in an adjacent repeating unit group 2000 is a third repeating unit 203" refers to that there is not any other repeat unit between the third repeat unit 203 and the first repeat unit 201, and there is not any other repeat unit between the third repeat unit 203 and the second repeat unit 202.

For example, referring to FIG. 4, in the repeating unit 200, the connecting sub-portion CSP of the first color sub-pixel 210 is bent toward the second color sub-pixel pair 220 with respect to the main body portion MP of the first color sub-pixel 210, and the connecting sub-portion CSP of the third color sub-pixel 230 is bent toward the second color sub-pixel pair 220 with respect to the main body portion MP of the third color sub-pixel 230; the connecting sub-portion CSP of the first color sub-pixel 210 at least includes a size-gradual-change part P1, the size-gradual-change part P1 is located between the edge of the connecting sub-portion CSP of the first color sub-pixel 210 away from the second color sub-pixel pair 220 and the opening OPN of the first color sub-pixel 210, and the size of the size-gradual-change part P1 in a direction perpendicular to the extending direction of the size-gradual-change part P1 of the first color sub-pixel 210 gradually changes; and the connecting sub-portion CSP of the third color sub-pixel 230 at least includes a size-gradual-change part P2, the size-gradual-change part P2 is located between the edge of the connecting sub-portion CSP of the third color sub-pixel 230 away from the second color sub-pixel pair 220 and the opening OPN of the third color sub-pixel 230, and the size of the size-gradual-change part P2 in a direction perpendicular to the extending direction of the size-gradual-change part P2 of the third color sub-pixel 230 gradually changes. For example, the area of the size-gradual-change portion P1 can be less than or equal to the area of the connecting sub-portion CSP.

For example, as illustrated in FIG. 4, in the direction from a position away from the first via hole H1 to a position close to the first via hole H1, the size of the size-gradual-change part P1 gradually increases, and the size of the size-gradual-change part P2 gradually increases. FIG. 4 illustrates a position PST2 away from the first via hole H1 and a position PST1 close to the first via hole H1. For example, the position away from the first via hole H1 and the position close to the first via hole H1 are both positions on the size-gradual-change part.

For example, as illustrated in FIG. 4, the connecting sub-portion CSP has a first edge E1 and a second edge E2 which are opposite to each other.

For example, as illustrated in FIG. 4, the included angle between the first edge E1 and the second edge E2 of the first electrode 231 of the first color sub-pixel 210 is greater than 0 and less than or equal to 17°, and the included angle between the first edge E1 and the second edge E2 of the first electrode 231 of the third color sub-pixel 230 is greater than 0 and less than or equal to 15°. For example, as illustrated in FIG. 4, for the first color sub-pixel 210 and the third color sub-pixel 230, the first edge E1 and the second edge E2 are straight lines, but are not limited thereto. For example, in other embodiments, the first edge E1 and the second edge E2 may also be lines of other types, such as fold lines, etc.

For example, as illustrated in FIG. 4, the included angle between the first edge E1 and the second edge E2 of the first electrode 231 of one of the two second color sub-pixels (the second color sub-pixel 2210) is greater than or equal to 0 and less than or equal to 60°, and an included angle between the first edge E1 and the second edge E2 of the first electrode 231 of the other of the two second color sub-pixels (the second color sub-pixel 2220) is greater than or equal to 5° and less than or equal to 60°. For example, as illustrated in FIG. 4, for the two second color sub-pixels 2210 and 2220, the first edge E1 and the second edge E2 are both fold lines, but are not limited thereto. For example, in other embodiments, the first edge E1 and the second edge E2 may also be lines of other types, such as straight lines, etc. For the first edge E1 in the form of a fold line and the second edge E2 in the form of a fold line, the maximum included angle between the lines is within the above range.

For example, as illustrated in FIG. 4, for each sub-pixel, the connecting sub-portion CSP has a first edge E1 and a second edge E2 which are opposite to each other, the main body portion CP has a first side SD1 and a second side SD2 which are opposite to each other and parallel with each other, the first side SD1 is connected with the first edge E1, and the second side SD2 is connected with the second edge E2; the length L5 of a line connecting a midpoint of the first edge E1 and a midpoint of an edge of the opening closest to the first edge E1 is greater than 5 μm, and the length L6 of a line connecting a midpoint of the second edge E2 and a midpoint of an edge of the opening closest to the second edge E2 is greater than 5 μm. In the embodiment of the present disclosure, due to the adjustment of the shape of the first electrode, the values of the length L5 and the length L6 are greater than those in the conventional technology.

For example, for each sub-pixel, the length L5 and the length L6 are greater than 6 μm. Further, for example, the length L5 and the length L6 are greater than 7 μm.

For example, in one embodiment, for the first color sub-pixel 210, the length L5 and the length L6 are greater than 7 μm; and for example, the length L5 can be 7.2 μm, and the length L6 can be 12 μm. For example, in one embodiment, for the second color sub-pixel 220, the length L5 and the length L6 are greater than 6 μm; and for example, the length L5 can be 9.1 μm, and the length L6 can be 6 μm. For example, in one embodiment, for the third color sub-pixel 230, the length L5 and the length L6 are greater than 5 μm; and for example, the length L5 can be 10 μm, and the length L6 can be 5.5 μm.

At present, the first electrode 231 of the light-emitting element 0220 is usually connected with the conductive connection element located below the first electrode 231 through a via hole, and receives a video/data signal. For example, the material of the conductive connection element includes metal.

For example, as illustrated in FIG. 4, the size SZ1 of the first via hole H1 in the first direction X is greater than the size SZ2 of the first via hole H1 in the second direction Y. In the display panel provided by the embodiment of the present disclosure, the connecting sub-portion CSP is designed to be widened, and therefore, the width of a position of the connecting portion CP in contact with the first via hole is relatively large, which is beneficial to increase the size of the first via hole H1 in the first direction X.

The display panels provided by the embodiments of the present disclosure, by increasing the critical dimension (CD) value of the first via hole H1, minimize the loading of video/data signals caused by contact resistance due to via hole, thereby improving the luminous performance of pixels and further improving the display effect of the display panel.

For example, compared with a general display panel, the display panel provided by the embodiment of the present disclosure increases the size of the first via hole H1 in the first direction to reduce contact resistance due to via hole. In the first color sub-pixel 210, the size of the first via hole H1 in the first direction X is 40%-60% of the size of the opening OPN in the first direction X; in the second color sub-pixel SP, the size of the first via hole H1 in the first direction X is 30%-50% of the size of the opening OPN in the first direction X; and in the third color sub-pixel 230, the size of the first via hole H1 in the first direction X is 30%-50% of the size of the opening OPN in the first direction X.

Figure 6:
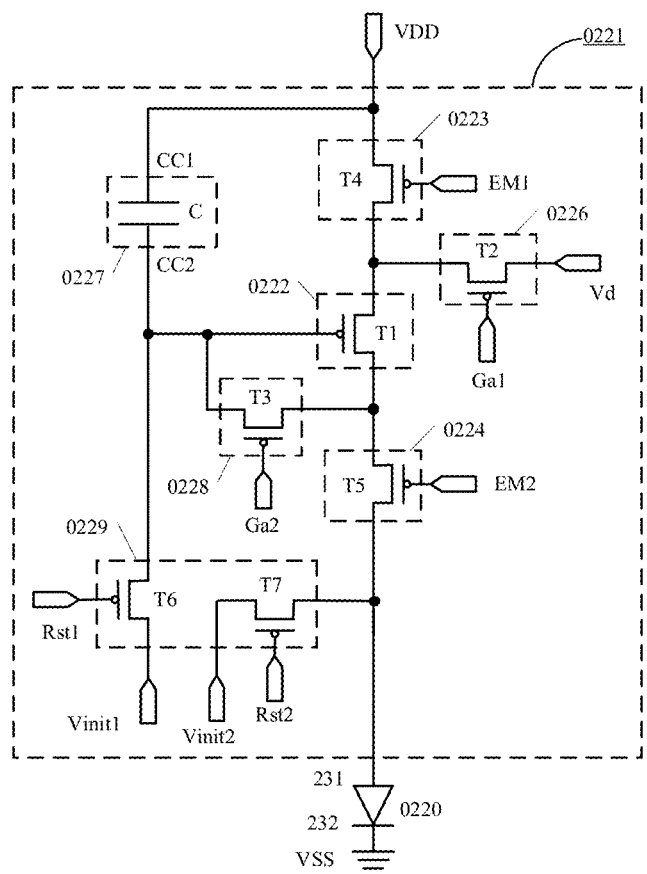
FIG. 6 is a schematic diagram of a pixel circuit included in a sub-pixel and connected with a light-emitting element.

FIG. 6 is a schematic diagram of a pixel circuit included in a sub-pixel and connected with a light-emitting element. As illustrated in FIG. 6, the pixel circuit 0221 of each sub-pixel can include a driving circuit 0222, a first light-emitting control circuit 0223, a second light-emitting control circuit 0224, a data writing circuit 0226, a storage circuit 0227, a threshold compensation circuit 0228, and a reset circuit 0229. The driving circuit 0222 includes a control terminal, a first terminal, and a second terminal, and is configured to provide the light-emitting element 0220 with a driving current for driving the light-emitting element 0220 to emit light.

For example, as illustrated in FIG. 6, the first light-emitting control circuit 0223 is connected with a first voltage terminal VDD and the first terminal of the driving circuit 0222, respectively, and is configured to turn on or off the path between the driving circuit 0222 and the first voltage terminal VDD; and the second light-emitting control circuit 0224 is connected with the second terminal of the driving circuit 0222 and the first electrode of the light-emitting element 0220, respectively, and is configured to turn on or off the path between the driving circuit 0222 and the light-emitting element 0220. The data writing circuit 0226 is electrically connected with the first terminal of the driving circuit 0222, and is configured to write a data signal into the storage circuit 0227 under the control of a scan signal. The storage circuit 0227 is electrically connected with the control terminal of the driving circuit 0222 and the first voltage terminal VDD, respectively, and is configured to store the data signal. The threshold compensation circuit 0228 is electrically connected with the control terminal and the second terminal of the driving circuit 0222, respectively, and is configured to perform threshold compensation on the driving circuit 0222. The reset circuit 0229 is electrically connected with the control terminal of the driving circuit 0222 and the first electrode of the light-emitting element 0220, respectively, and is configured to reset the control terminal of the driving circuit 0222 and the first electrode of the light-emitting element 0220 under the control of a reset control signal.

For example, as illustrated in FIG. 6, the driving circuit 0222 includes a driving transistor T1, the control terminal of the driving circuit 0222 includes a gate terminal of the driving transistor T1, the first terminal of the driving circuit 0222 includes a first terminal of the driving transistor T1, and the second terminal of the driving circuit 0222 includes a second terminal of the driving transistor T1. The data writing circuit 0226 includes a data writing transistor T2, the storage circuit 0227 includes a capacitor C, the threshold compensation circuit 0228 includes a threshold compensation transistor T3, the first light-emitting control circuit 0223 includes a first light-emitting control transistor T4, the second light-emitting control circuit 0224 includes a second light-emitting control transistor T5, the reset circuit 0229 includes a first reset transistor T6 and a second reset transistor T7, and the reset control signal can includes a first reset control signal and a second reset control signal.

For example, as illustrated in FIG. 6, a first terminal of the data writing transistor T2 is electrically connected with the first terminal of the driving transistor T1, a second terminal of the data writing transistor T2 is configured to be electrically connected with a data line Vd to receive a data signal, and a gate terminal of the data writing transistor T2 is configured to be electrically connected with a first scan signal line Ga1 to receive a scan signal; a first terminal CC1 of the capacitor C is electrically connected with a first power terminal VDD, and a second terminal CC2 of the capacitor C is electrically connected with the gate terminal of the driving transistor T1; a first terminal of the threshold compensation transistor T3 is electrically connected with the second terminal of the driving transistor T1, a second terminal of the threshold compensation transistor T3 is electrically connected with the gate terminal of the driving transistor T1, and a gate terminal of the threshold compensation transistor T3 is configured to be electrically connected with a second scan signal line Ga2 to receive a compensation control signal; a first terminal of the first reset transistor T6 is electrically connected with a first initialization power terminal Vinit1 to receive a first initialization signal, a second terminal of the first reset transistor T6 is electrically connected with the gate terminal of the driving transistor T1, and a gate terminal of the first reset transistor T6 is electrically connected with a first reset control signal line Rst1 to receive a first reset control signal; a first terminal of the second reset transistor T7 is configured to be electrically connected with a second initialization power terminal Vinit2 to receive a second initialization signal, a second terminal of the second reset transistor T7 is electrically connected with the first electrode of the light-emitting element 0220, and a gate terminal of the second reset transistor T7 is configured to be electrically connected with a second reset control signal line Rst2 to receive a second reset control signal; a first terminal of the first light-emitting control transistor T4 is electrically connected with the first power terminal VDD, a second terminal of the first light-emitting control transistor T4 is electrically connected with the first terminal of the driving transistor T1, and the gate terminal of the first light-emitting control transistor T4 is configured to be electrically connected with a first light-emitting control signal line EM1 to receive a first light-emitting control signal; a first terminal of the second light-emitting control transistor T5 is electrically connected with the second terminal of the driving transistor T1, a second terminal of the second light-emitting control transistor T5 is electrically connected with the first electrode of the light-emitting element 0220, and the gate terminal of the second light-emitting control transistor T5 is configured to be electrically connected with a second light-emitting control signal line EM2 to receive a second light-emitting control signal; and the second electrode of the light-emitting element 0220 is electrically connected with a second power terminal VSS.

For example, one of the first power terminal VDD and the second power terminal VSS is a high voltage terminal, and the other of the first power terminal VDD and the second power terminal VSS is a low voltage terminal. For example, in the embodiment illustrated in FIG. 6, the first power terminal VDD is a voltage source to output a constant first voltage, and the first voltage is a positive voltage; and the second power terminal VSS can be a voltage source to output a constant second voltage, and the second voltage is a negative voltage, etc. For example, in some examples, the second power terminal VSS can be grounded. For example, the second electrode is connected with the second power terminal VSS.

For example, as illustrated in FIG. 6, the scan signal and the compensation control signal can be the same, that is, the gate terminal of the data writing transistor T2 and the gate terminal of the threshold compensation transistor T3 can be electrically connected with the same signal line, for example, the first scan signal line Ga1, so as to receive the same signal (e.g., the scan signal); in this case, the display panel may not be provided with the second scan signal line Ga2, and the number of signal lines is reduced. For another example, the gate terminal of the data writing transistor T2 and the gate terminal of the threshold compensation transistor T3 can also be electrically connected with different signal lines, respectively, that is, the gate terminal of the data writing transistor T2 is electrically connected with the first scan signal line Ga1, the gate terminal of the threshold compensation transistor T3 is electrically connected with the second scan signal line Ga2, and the signals transmitted by the first scan signal line Ga1 and the second scan signal line Ga2 are the same.

It should be noted that the scan signal and the compensation control signal may also be different, so that the gate terminal of the data writing transistor T2 and the threshold compensation transistor T3 can be controlled separately, thus increasing the flexibility of controlling the pixel circuit.

For example, as illustrated in FIG. 6, the first light-emitting control signal and the second light-emitting control signal can be the same, that is, the gate terminal of the first light-emitting control transistor T4 and the gate terminal of the second light-emitting control transistor T5 can be electrically connected with the same signal line, for example, the first light-emitting control signal line EM1, so as to receive the same signal (e.g., the first light-emitting control signal); in this case, the display panel may not be provided with the second light-emitting control signal line EM2, and the number of signal lines is reduced. For another example, the gate terminal of the first light-emitting control transistor T4 and the gate terminal of the second light-emitting control transistor T5 can also be electrically connected with different signal lines, respectively, that is, the gate terminal of the first light-emitting control transistor T4 is electrically connected with the first light-emitting control signal line EM1, the gate terminal of the second light-emitting control transistor T5 is electrically connected with the second light-emitting control signal line EM2, and the signals transmitted by the first light-emitting control signal line EM1 and the second light-emitting control signal line EM2 are the same.

It should be noted that in the case where the first light-emitting control transistor T4 and the second light-emitting control transistor T5 are transistors of different types, for example, the first light-emitting control transistor T4 is a P-type transistor and the second light-emitting control transistor T5 is an N-type transistor, the first light-emitting control signal and the second light-emitting control signal may also be different, without being limited in the embodiment of the present disclosure.

For example, the first reset control signal and the second reset control signal can be the same, that is, the gate terminal of the first reset transistor T6 and the gate terminal of the second reset transistor T7 can be electrically connected with the same signal line, for example, the first reset control signal line Rst1, so as to receive the same signal (e.g., the first reset control signal); in this case, the display panel may not be provided with the second reset control signal line Rst2, and the number of signal lines is reduced. For another example, the gate terminal of the first reset transistor T6 and the gate terminal of the second reset transistor T7 can also be electrically connected with different signal lines, respectively, that is, the gate terminal of the first reset transistor T6 is electrically connected with the first reset control signal line Rst1, the gate terminal of the second reset transistor T7 is electrically connected with the second reset control signal line Rst2, and the signals transmitted by the first reset control signal line Rst1 and the second reset control signal line Rst2 are the same. It should be noted that the first reset control signal and the second reset control signal may also be different.

For example, in some examples, the second reset control signal can be the same as the scan signal, that is, the gate terminal of the second reset transistor T7 can be electrically connected with the scan signal line Ga to receive the scan signal as the second reset control signal.

For example, the first terminal of the first reset transistor T6 and the first terminal of the second reset transistor T7 are connected with the first initialization power terminal Vinit1 and the second initialization power terminal Vinit2, respectively, and the first initialization power terminal Vinit1 and the second initialization power terminal Vinit2 can be direct current (DC) reference voltage terminals to output constant DC reference voltages. The first initialization power terminal Vinit1 and the second initialization power terminal Vinit2 can be the same; for example, the first terminal of the first reset transistor T6 and the first terminal of the second reset transistor T7 are connected with the same reset power terminal. The first initialization power terminal Vinit1 and the second initialization power terminal Vinit2 can be high voltage terminals or low voltage terminals as long as they can provide the first initialization signal and the second initialization signal to reset the gate terminal of the driving transistor T1 and the first electrode of the light-emitting element 0220, which is not limited in the present disclosure. For example, the first terminal of the first reset transistor T6 and the first terminal of the second reset transistor T7 can both be connected with a reset power signal line (an initialization signal line) Init.

It should be noted that the driving circuit 0222, the data writing circuit 0226, the storage circuit 0227, the threshold compensation circuit 0228, and the reset circuit 0229 in the pixel circuit illustrated in FIG. 6 are merely illustrative, and the structures of circuits, such as the driving circuit 0222, the data writing circuit 0226, the storage circuit 0227, the threshold compensation circuit 0228, and the reset circuit 0229, etc., can be set according to the actual application requirements, which are not limited in the embodiments of the present disclosure.

For example, according to the characteristics of transistors, the transistors can be divided into N-type transistors and P-type transistors. For the sake of clarity, the embodiment of the present disclosure takes that the transistors are P-type transistors (e.g., P-type MOS transistors) as an example to elaborate the technical solutions of the present disclosure. That is, in the description of the present disclosure, the driving transistor T1, the data writing transistor T2, the threshold compensation transistor T3, the first light-emitting control transistor T4, the second light-emitting control transistor T5, the first reset transistor T6, and the second reset transistor T7, etc., can all be P-type transistors. However, the transistors in the embodiments of the present disclosure are not limited to P-type transistors, and those skilled in the art can also realize the functions of one or more transistors in the embodiment of the present disclosure by using N-type transistors (e.g., N-type MOS transistors) according to actual needs.

It should be noted that the transistors adopted in the embodiment of the present disclosure can be thin film transistors, field effect transistors or other switching elements with the same characteristics, and the thin film transistors can include oxide semiconductor thin film transistors, amorphous silicon thin film transistors or poly-silicon thin film transistors, etc. The source electrode and the drain electrode of the transistor can be symmetrical in structure, so the source electrode and the drain electrode can be indistinguishable in physical structure. In the embodiment of the present disclosure, in order to distinguish transistors, except for the gate terminal serving as the control terminal, it is directly described that one of the source electrode and the drain electrode is the first terminal and the other of the source electrode and the drain electrode is the second terminal. Therefore, the first terminal and the second terminal of all or part of the transistors in the embodiment of the present disclosure can be interchanged as needed.

It should be noted that, in the embodiment of the present disclosure, the pixel circuit of the sub-pixel can have a 7T1C structure (i.e., seven transistors and one capacitor) as illustrated in FIG. 6, and can also have a structure including other number of transistors or capacitors, such as a 7T2C structure, a 6T1C structure, a 6T2C structure or a 9T2C structure, without being limited in the embodiment of the present disclosure.

Figure 7:
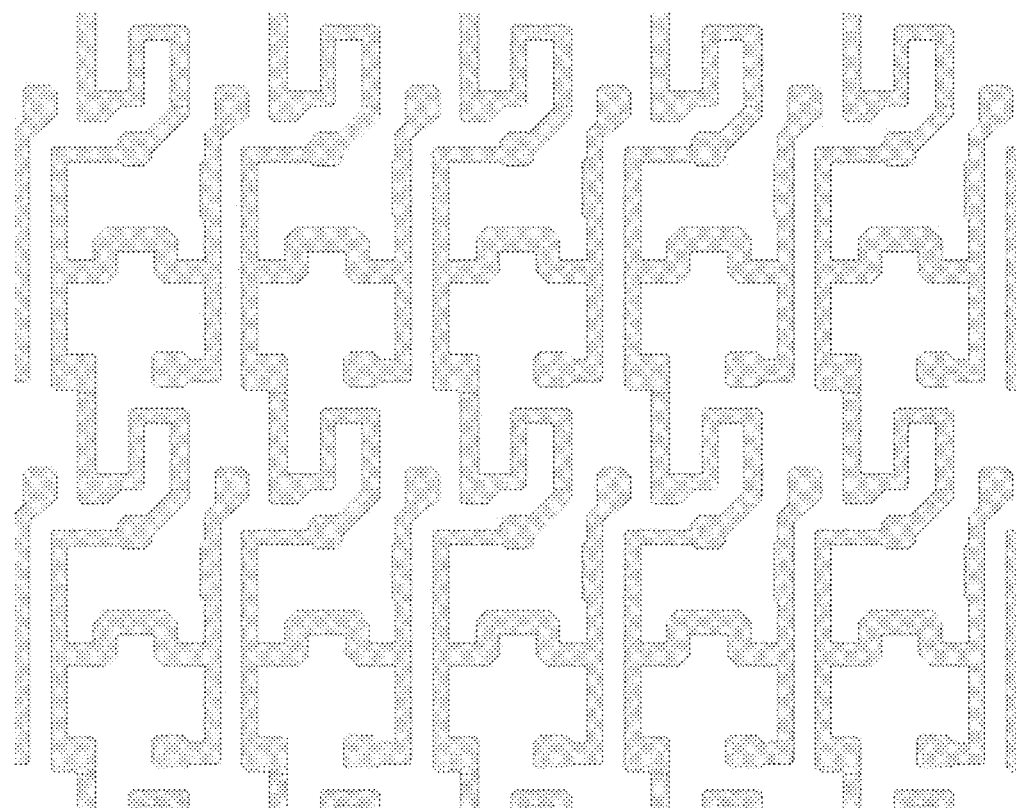
FIG. 7 is a plan view of a semiconductor pattern in a display panel provided by an embodiment of the present disclosure.
Figure 8:
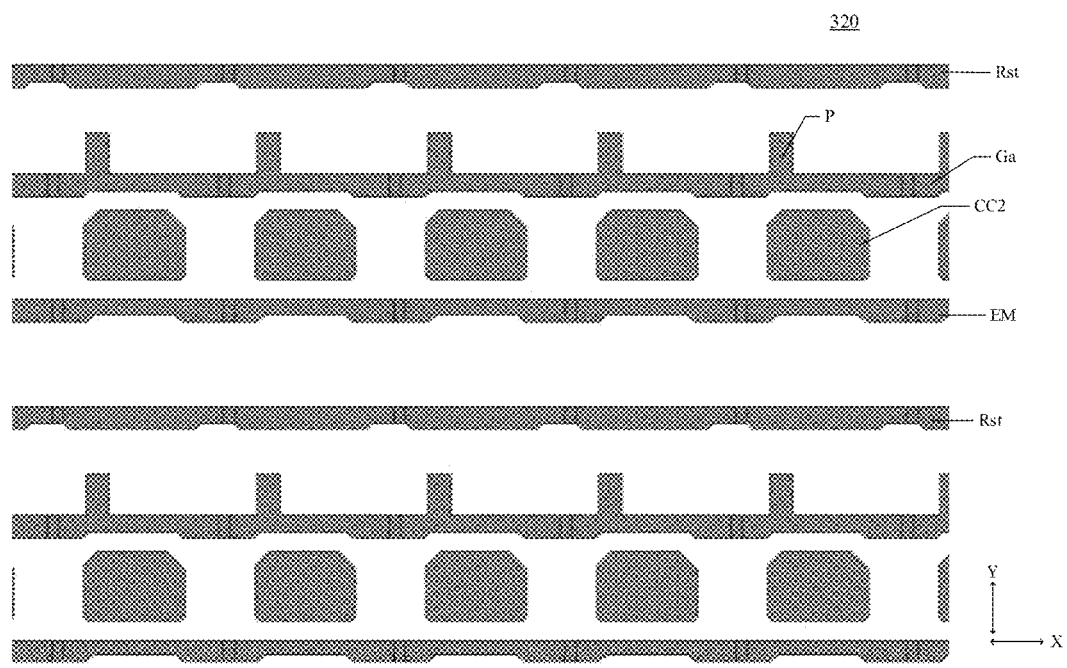
FIG. 8 is a plan view of a first conductive layer in a display panel provided by an embodiment of the present disclosure.
Figure 9:
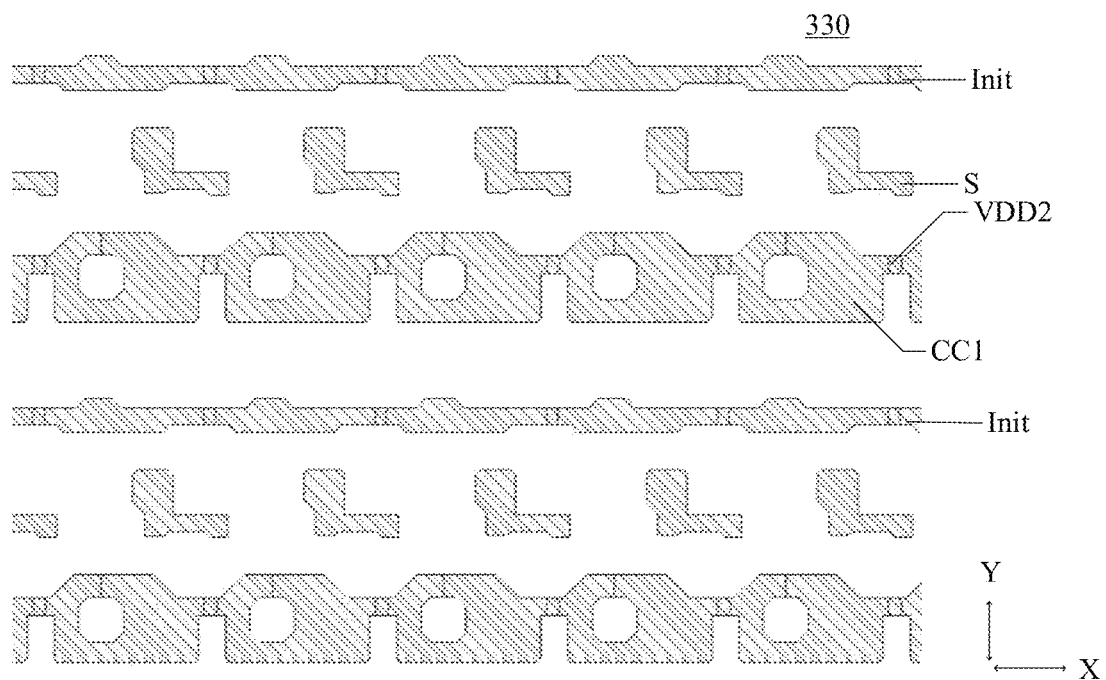
FIG. 9 is a plan view of a second conductive layer in a display panel provided by an embodiment of the present disclosure.
Figure 10:
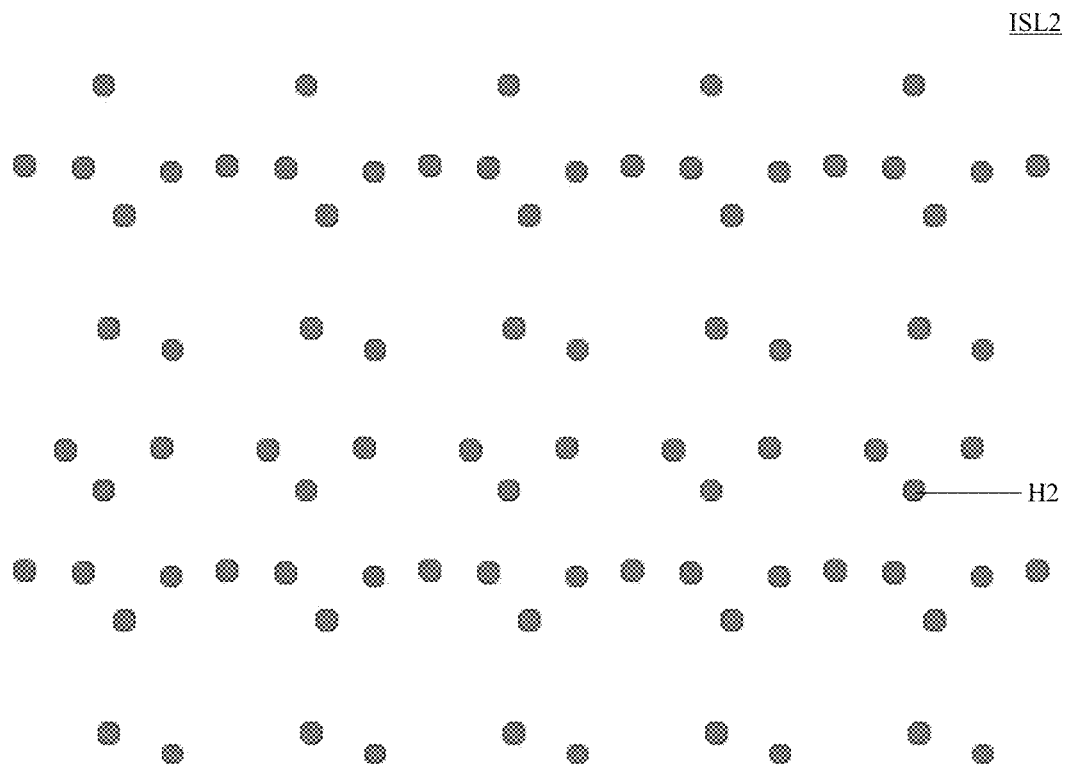
FIG. 10 is a plan view of a second insulating layer in a display panel provided by an embodiment of the present disclosure.
Figure 11:
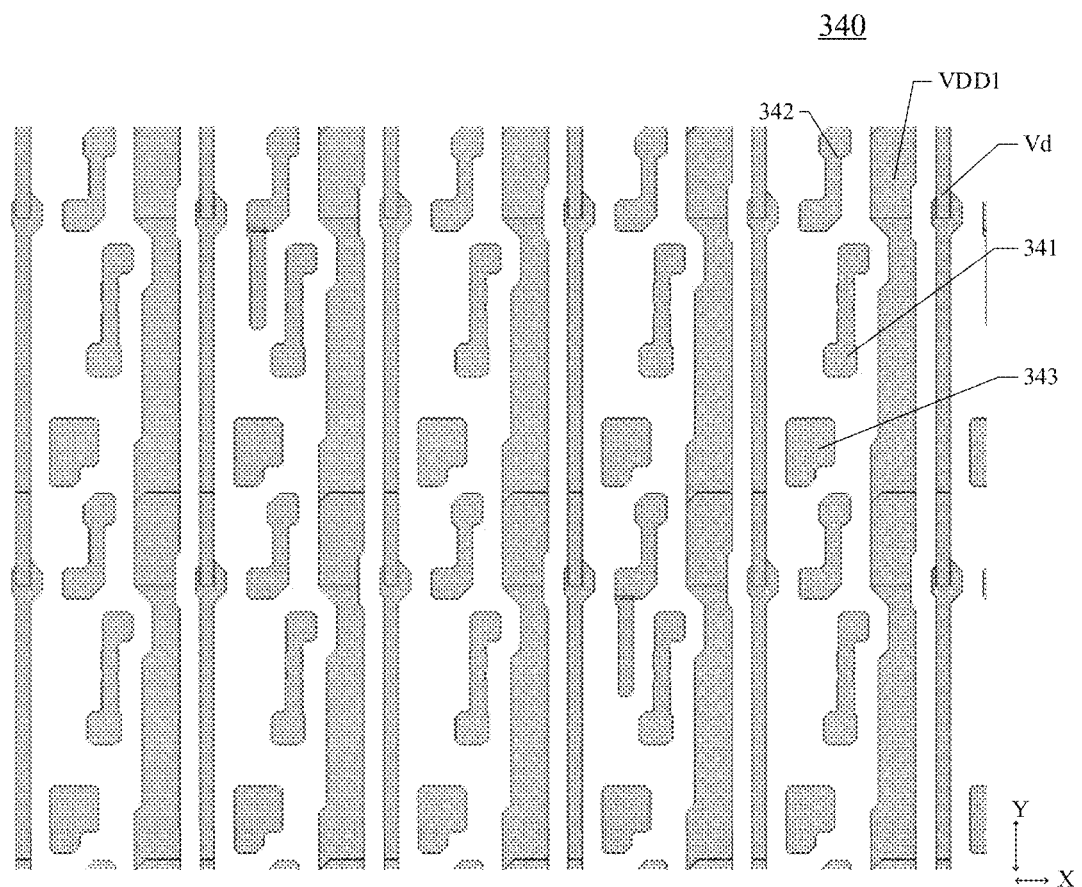
FIG. 11 is a plan view of a third conductive layer in a display panel provided by an embodiment of the present disclosure.
Figure 12:
FIG. 12 is a plan view of a first insulating layer in a display panel provided by an embodiment of the present disclosure.
Figure 12:
Figure 13:
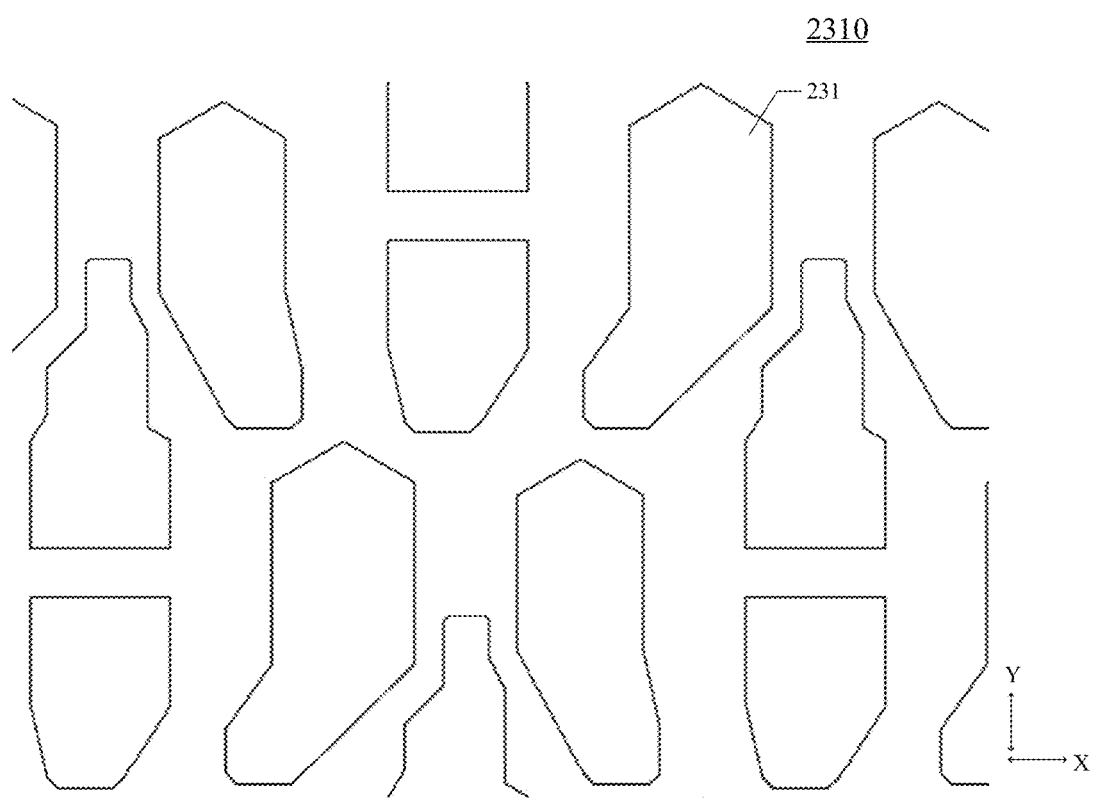
FIG. 13 is a plan view of a first electrode layer in a display panel provided by an embodiment of the present disclosure.
Figure 14:
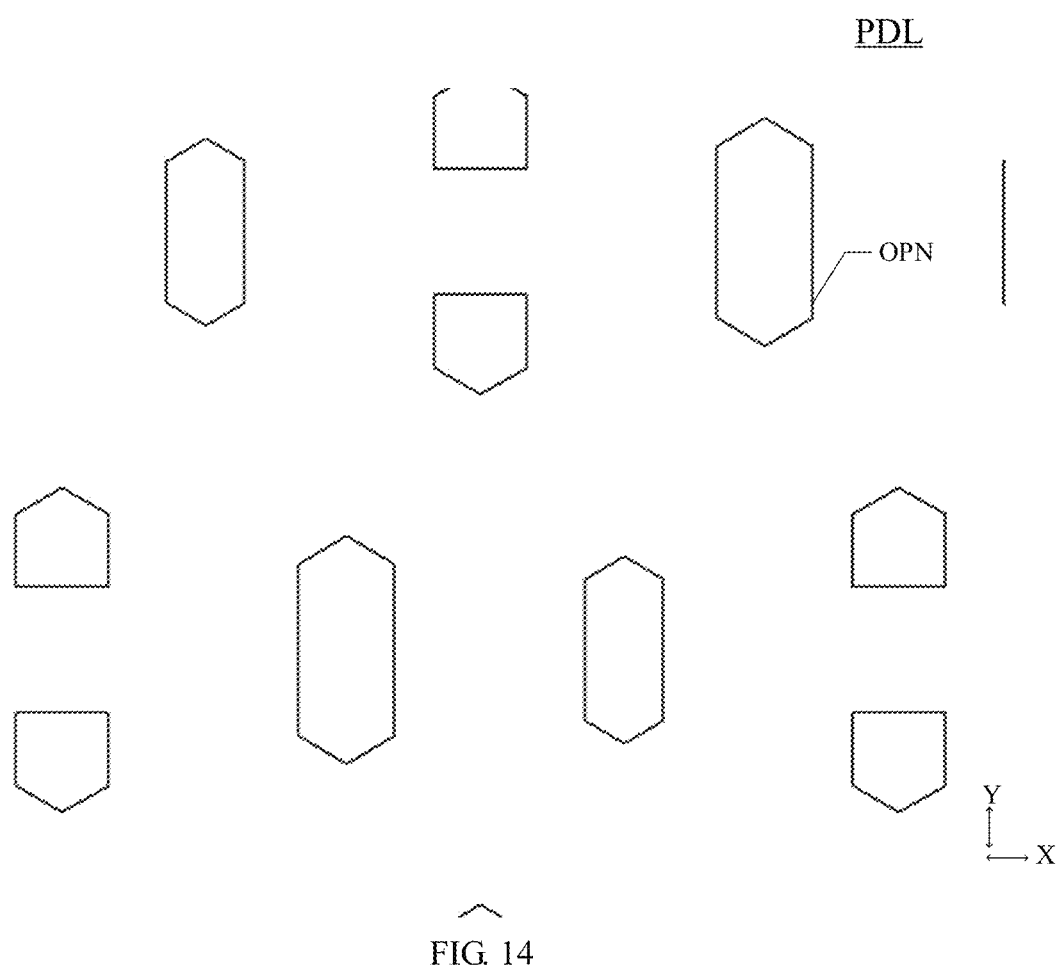
FIG. 14 is a plan view of a pixel definition layer in a display panel provided by an embodiment of the present disclosure.
Figure 15:
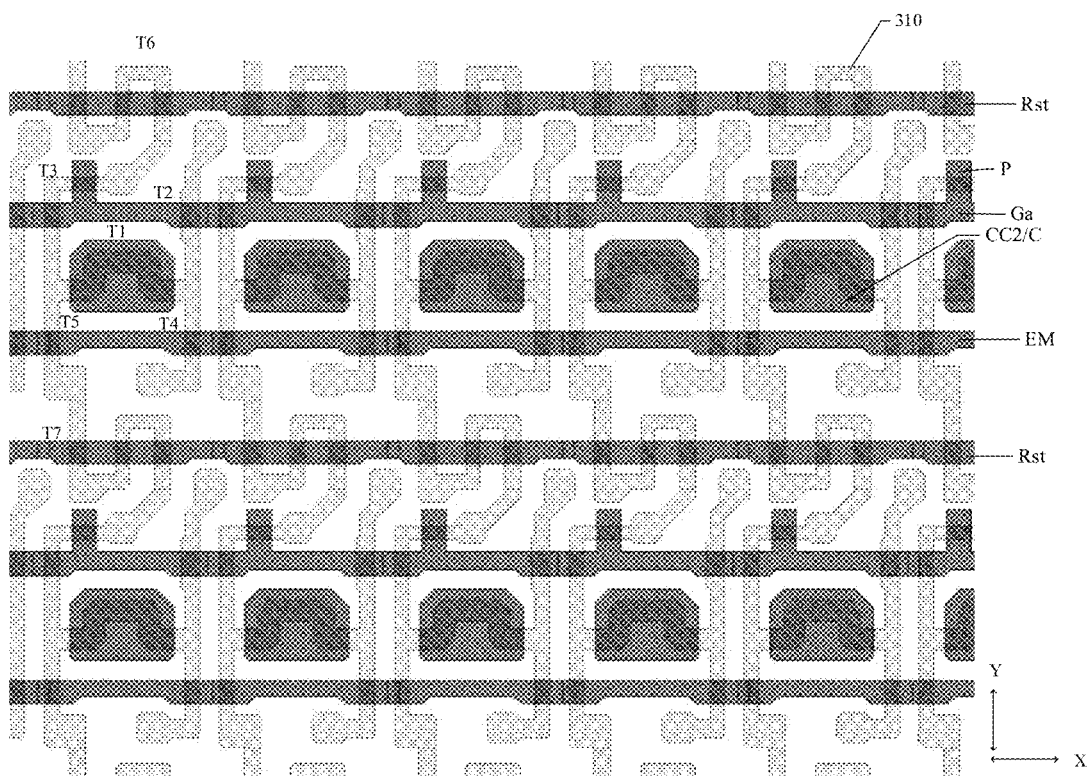
FIG. 15 is a schematic diagram of forming an active layer, a source electrode, and a drain electrode of a thin film transistor in a display panel provided by an embodiment of the present disclosure.

FIG. 7 is a plan view of a semiconductor pattern in a display panel provided by an embodiment of the present disclosure. FIG. 8 is a plan view of a first conductive layer in a display panel provided by an embodiment of the present disclosure. FIG. 9 is a plan view of a second conductive layer in a display panel provided by an embodiment of the present disclosure. FIG. 10 is a plan view of a second insulating layer in a display panel provided by an embodiment of the present disclosure. FIG. 11 is a plan view of a third conductive layer in a display panel provided by an embodiment of the present disclosure. FIG. 12 is a plan view of a first insulating layer in a display panel provided by an embodiment of the present disclosure. FIG. 13 is a plan view of a first electrode layer in a display panel provided by an embodiment of the present disclosure. FIG. 14 is a plan view of a pixel definition layer in a display panel provided by an embodiment of the present disclosure. FIG. 15 is a schematic diagram of forming an active layer, a source electrode and a drain electrode of a thin film transistor in a display panel provided by an embodiment of the present disclosure.

Figure 16:
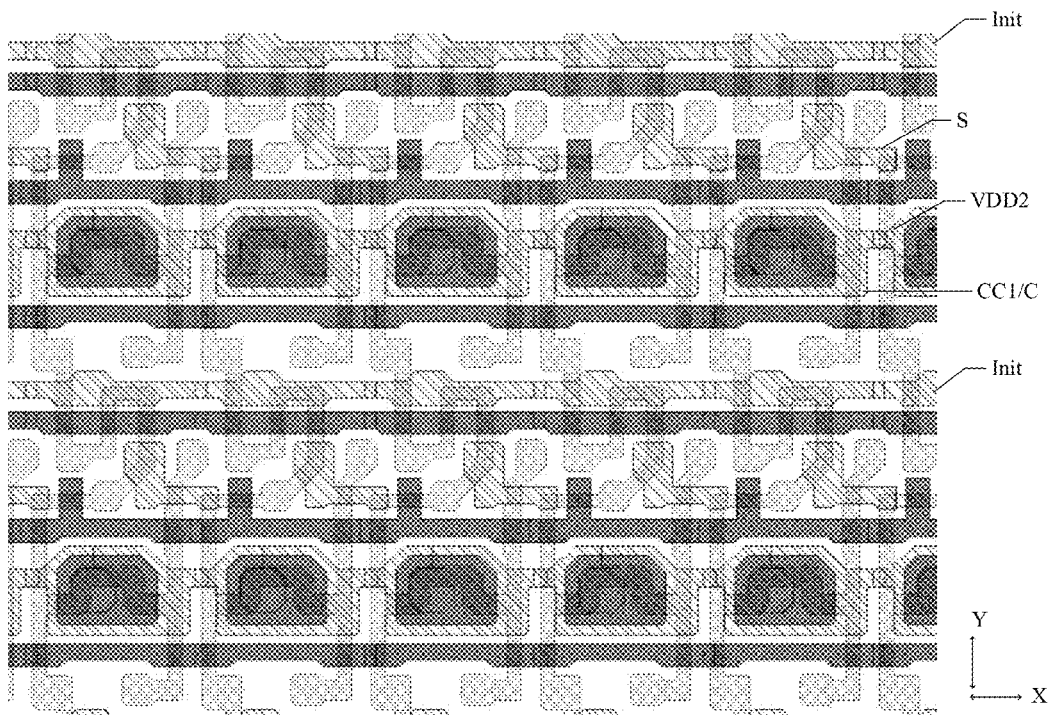
FIG. 16 is a schematic plan view of a display panel after forming a second conductive layer according to an embodiment of the present disclosure.
Figure 17:
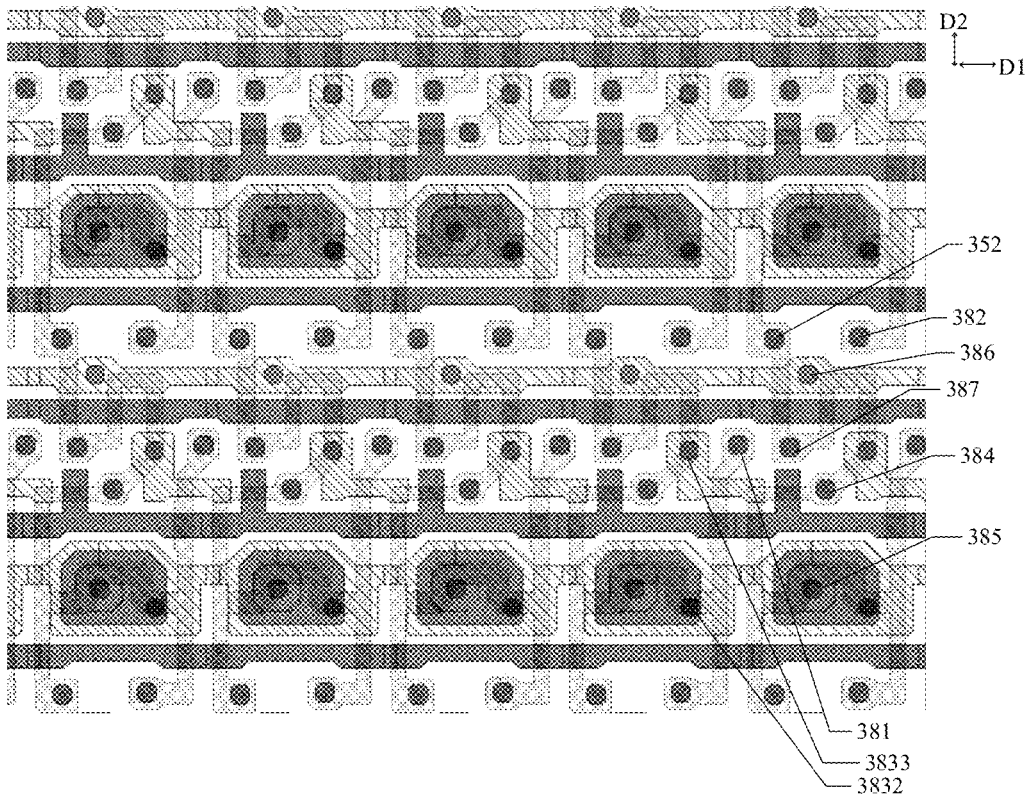
FIG. 17 is a schematic plan view of a display panel after forming a first insulating layer according to an embodiment of the present disclosure.
Figure 18:
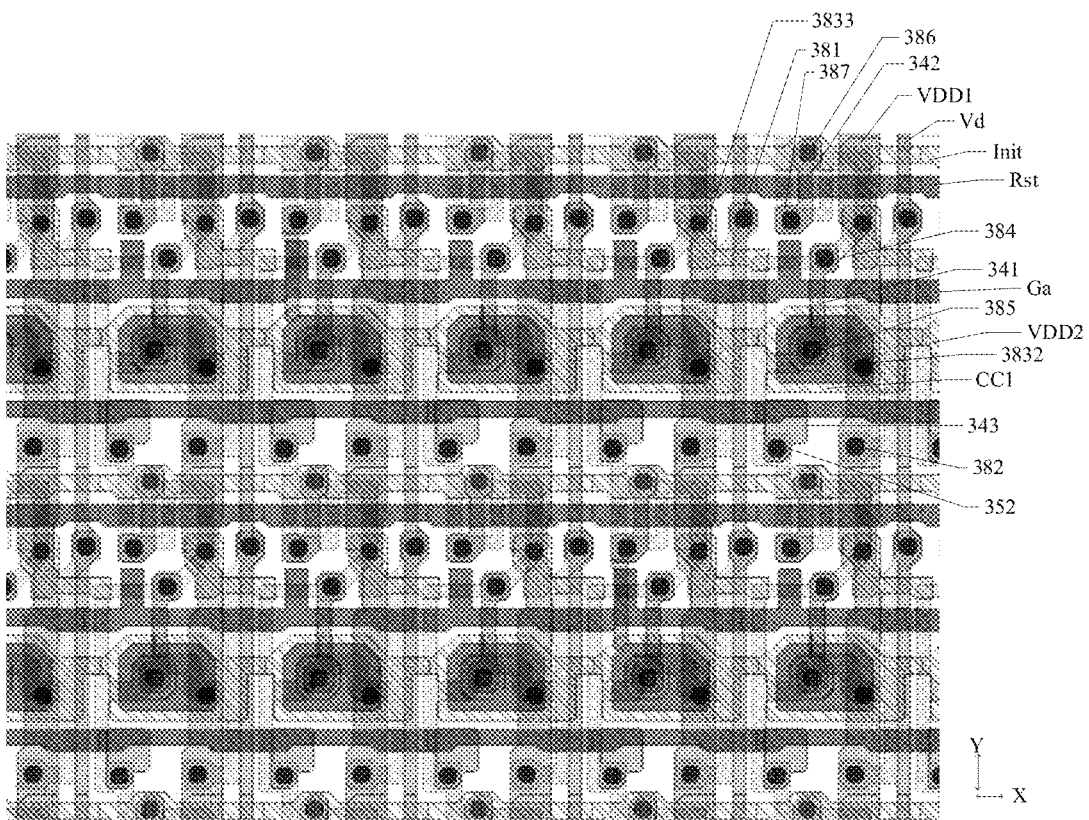
FIG. 18 is a schematic plan view of forming a third conductive layer in a display panel according to an embodiment of the present disclosure.
Figure 19:
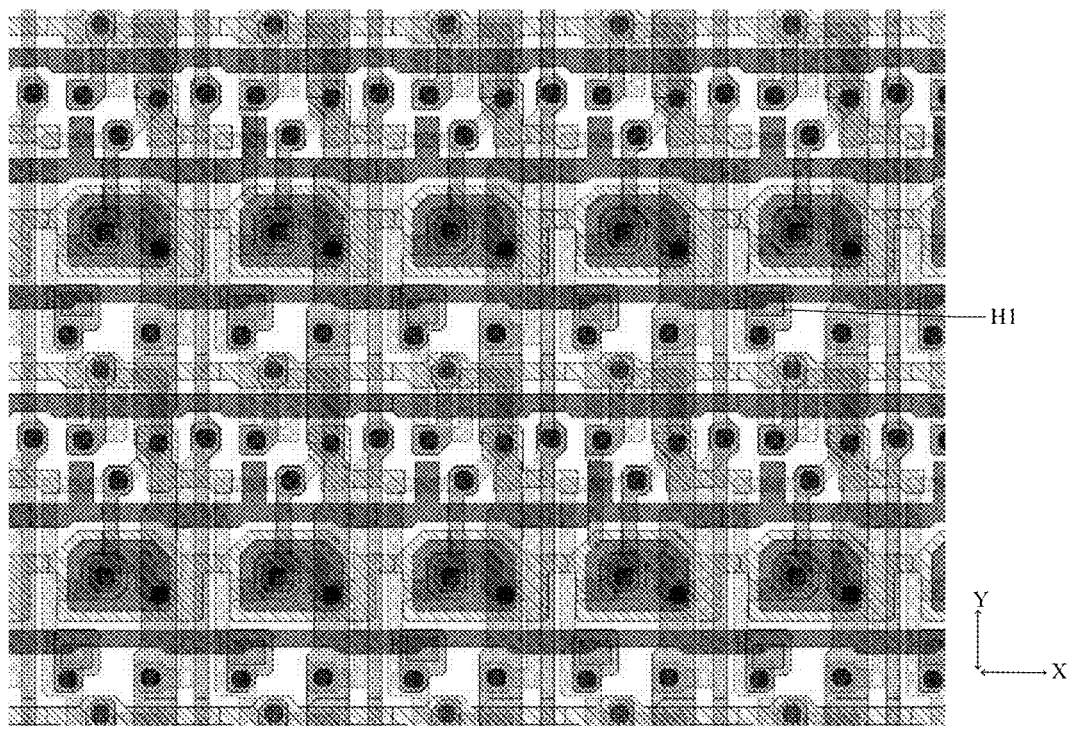
FIG. 19 is a schematic plan view of a display panel after forming a second insulating layer according to an embodiment of the present disclosure.
Figure 20:
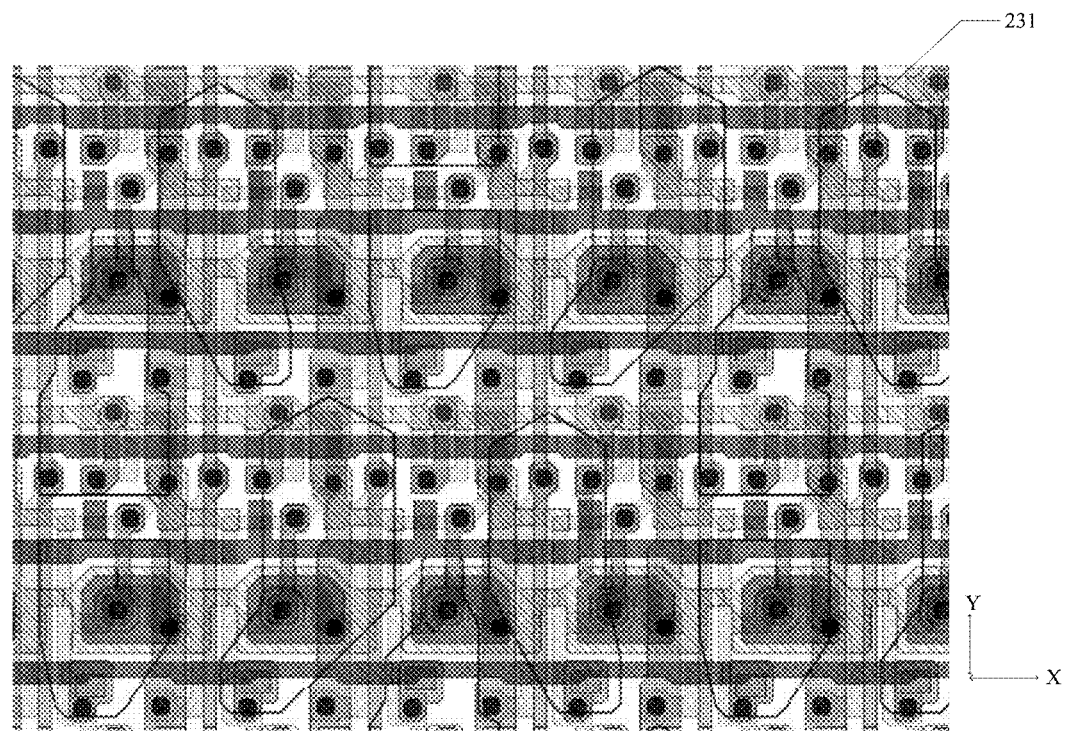
FIG. 20 is a schematic plan view of a display panel after forming a first electrode layer according to an embodiment of the present disclosure.
Figure 21:
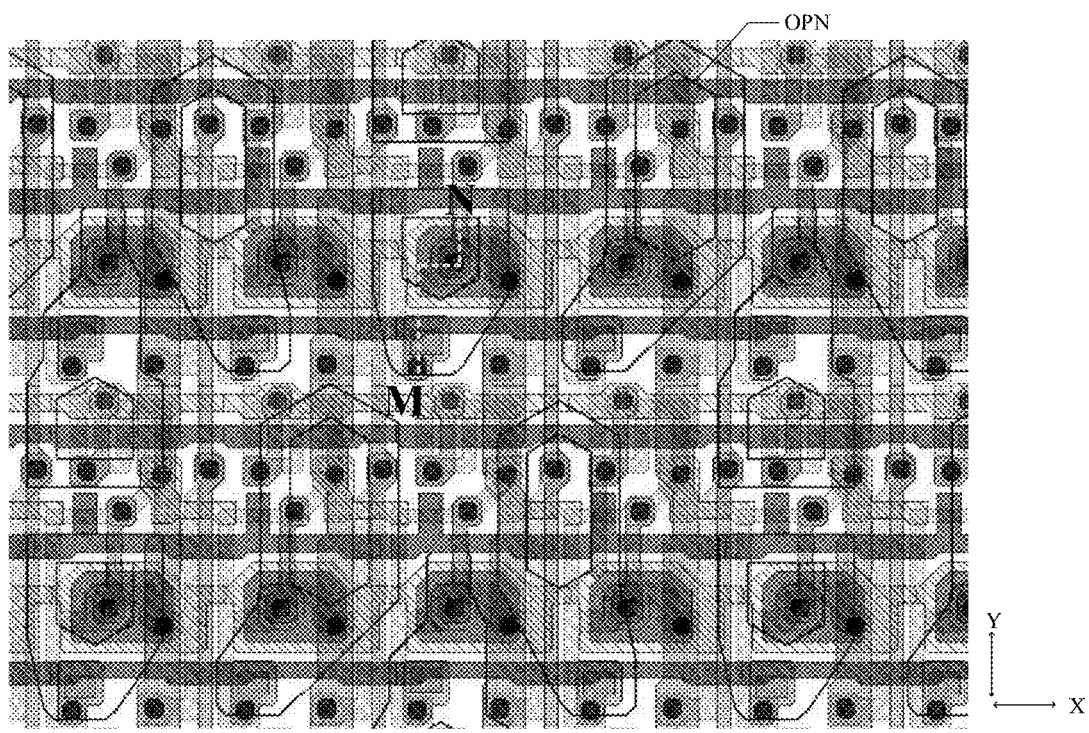
FIG. 21 is a schematic plan view of a display panel after forming a pixel definition layer according to an embodiment of the present disclosure.
Figure 22:
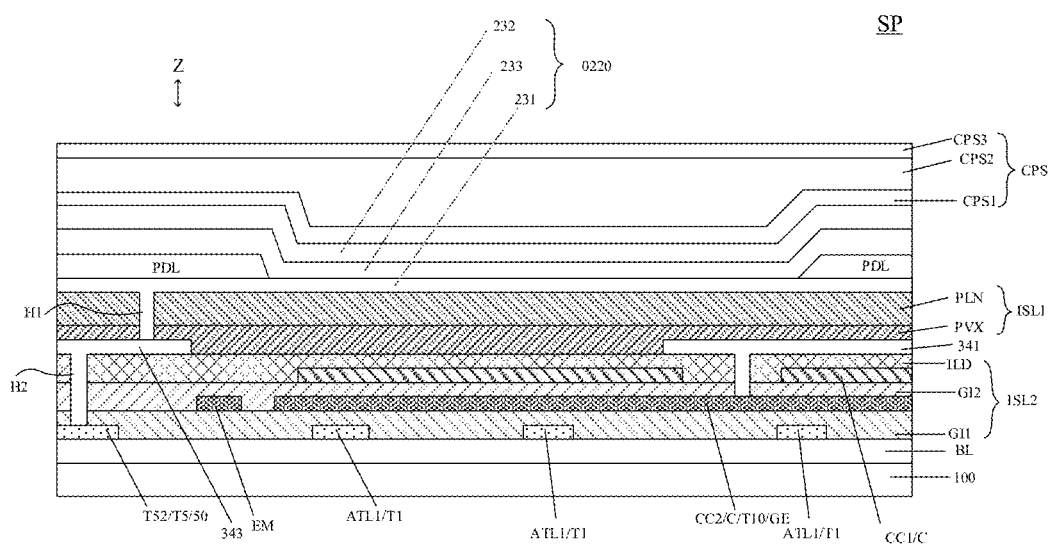
FIG. 22 is a cross-sectional view of a display panel provided by an embodiment of the present disclosure.

FIG. 16 is a schematic plan view of a display panel after forming a second conductive layer provided by an embodiment of the present disclosure. FIG. 17 is a schematic plan view of a display panel after forming a first insulating layer provided by an embodiment of the present disclosure. FIG. 18 is a schematic plan view of forming a third conductive layer in a display panel provided by an embodiment of the present disclosure. FIG. 19 is a schematic plan view of a display panel after forming a second insulating layer provided by an embodiment of the present disclosure. FIG. 20 is a schematic plan view of a display panel after forming a first electrode layer provided by an embodiment of the present disclosure. FIG. 21 is a schematic plan view of a display panel after forming a pixel definition layer provided by an embodiment of the present disclosure. FIG. 22 is a cross-sectional view of a display panel provided by an embodiment of the present disclosure. FIG. 22 can be a cross-sectional view taken along line M-N in FIG. 21 (with the addition of structures such as the encapsulation layer, the light-emitting functional layer, the second electrode, etc.). In the embodiment of the present disclosure, for the sake of clarity, in the plan view, the insulating layer is illustrated in the form of a via hole, and the insulating layer itself is transparent.

FIG. 7 illustrates a semiconductor pattern PTL, FIG. 8 illustrates a first conductive layer 320, FIG. 9 illustrates a second conductive layer 330, FIG. 10 illustrates a second via hole H2 in a second insulating layer ISL2, FIG. 11 illustrates a third conductive layer 340, FIG. 12 illustrates a first via hole H1 in a first insulating layer ISL1, FIG. 13 illustrates a first electrode layer 2310, and FIG. 14 illustrates an opening OPN in a pixel definition layer.

As illustrated in FIG. 15 and FIG. 16, the pixel circuit 0221 of the sub-pixel includes the driving transistor T1, the data writing transistor T2, the threshold compensation transistor T3, the first light-emitting control transistor T4, the second light-emitting control transistor T5, the first reset transistor T6, the second reset transistor T7, and the capacitor C illustrated in FIG. 6. As illustrated in FIG. 15 and FIG. 16, the capacitor C includes a first terminal CC1 and a second terminal CC2.

For example, FIG. 15 illustrates the active semiconductor layer 310 of the pixel circuit in the display panel. FIG. 7 illustrates a semiconductor pattern PTL; a doping process is performed on the semiconductor pattern PTL by using the first conductive layer 320 as a mask, so that the region of the semiconductor pattern PTL covered by the first conductive layer 320 retains the semiconductor characteristics and forms an active layer, while the region of the semiconductor pattern PTL not covered by the first conductive layer 320 is converted into a conductor to form the source electrode and the drain electrode of the thin film transistor. The active semiconductor layer 310 can be formed by a patterning process on a semiconductor material. The active semiconductor layer 310 can be used to manufacture the active layers of the driving transistor T1, the data writing transistor T2, the threshold compensation transistor T3, the first light-emitting control transistor T4, the second light-emitting control transistor T5, the first reset transistor T6, and the second reset transistor T7 mentioned above. The active semiconductor layer 310 includes the active layer patterns (channel regions) and doped region patterns (source/drain doped regions) of the transistors of each sub-pixel, and the active layer pattern and doped region patterns of each transistor in the same pixel circuit are of an integral structure. The material of the semiconductor pattern PTL includes, but is not limited to, low temperature poly-silicon.

It should be noted that the active semiconductor layer includes an active layer, a source region and a drain region, and the source region and the drain region can be made to be conductive by doping, etc., to realize the electrical connection of each structure. That is, the active semiconductor layer of each transistor in each sub-pixel is an integral pattern formed by poly-silicon, and each transistor in the same pixel circuit includes doped region patterns (i.e., a source region and a drain region) and an active layer pattern, and the active layers of different transistors are separated by doped structures. The source region and the drain region form the source electrode and the drain electrode of the transistor, respectively.

For example, the active semiconductor layer 310 can be made of amorphous silicon, poly-silicon, an oxide semiconductor material, and the like. It should be noted that the source region and the drain region can be regions doped with N-type impurities or P-type impurities.

For example, the active semiconductor layers in the pixel circuits of different color sub-pixels arranged in the first direction X have no connection relationship and are disconnected from each other. The active semiconductor layers in the pixel circuits of the sub-pixels arranged in the second direction Y can be integrated, or can be disconnected from each other.

Some accompanying drawings among FIG. 7 to FIG. 21 also illustrate a scan signal line Ga (including a first scan signal line Ga1 and a second scan signal line Ga2), a reset control signal line Rst (including a first reset control signal line Rst1 and a second reset control signal line Rst2), a reset power signal line Init serving as a reset power terminal (including a first reset power signal line Init1 serving as a first initialization power terminal Vinit1 and a second reset power signal line Init2 serving as a second initialization power terminal Vinit2), a light-emitting control signal line EM (including a first light-emitting control signal line EM1 and a second light-emitting control signal line EM2), a data line Vd, and a power signal line VDD (including a first power signal line VDD1 and a second power signal line VDD2). The first power signal line VDD1 and the second power signal line VDD2 are electrically connected with each other. For example, the second direction Y is the extending direction of the data line Vd.

It should be noted that, in the example illustrated in FIG. 7 to FIG. 21, the first scan signal line Ga1 and the second scan signal line Ga2 are the same scan signal line Ga, the first reset power signal line Int1 and the second reset power signal line Init2 are the same reset power signal line Init, the first reset control signal line Rst1 and the second reset control signal line Rst2 are the same reset control signal line Rst, and the first light-emitting control signal line EM1 and the second light-emitting control signal line EM2 are the same light-emitting control signal line EM, but are not limited thereto. For example, the first direction X is the extending direction of the scan signal line Ga.

For example, the gate metal layer of the pixel circuit can include a first conductive layer and a second conductive layer. On the active semiconductor layer 310, a gate insulating layer (the first gate insulating layer GI1 illustrated in FIG. 22) is formed to insulate the active semiconductor layer 310 from the gate metal layer subsequently formed. FIG. 8 illustrates a first conductive layer 320 included in the display panel, and the first conductive layer 320 is disposed at a side of the first gate insulating layer GI1 (see FIG. 22) away from the active semiconductor layer 310, so as to be insulated from the active semiconductor layer 310. As illustrated in FIG. 8, the first conductive layer 320 can include the second terminal CC2 of the capacitor C, the scan signal line Ga, the reset control signal line Rst, the light-emitting control signal line EM, and the gate terminals of the driving transistor T1, the data writing transistor T2, the threshold compensation transistor T3, the first light-emitting control transistor T4, the second light-emitting control transistor T5, the first reset transistor T6, and the second reset transistor T7.

For example, as illustrated in FIG. 8 and FIG. 15, the gate terminal of the data writing transistor T2 can be a portion of the scan signal line Ga which is overlapped with the active semiconductor layer 310; the gate terminal of the first light-emitting control transistor T4 can be a first portion of the light-emitting control signal line EM which is overlapped with the active semiconductor layer 310, and the gate terminal of the second light-emitting control transistor T5 can be a second portion of the light-emitting control signal line EM which is overlapped with the active semiconductor layer 310; the gate terminal of the first reset transistor T6 can be a first portion of the reset control signal line Rst which is overlapped with the active semiconductor layer 310, and the gate terminal of the second reset transistor T7 can be a second portion of the reset control signal line Rst which is overlapped with the active semiconductor layer 310; the threshold compensation transistor T3 can be a thin film transistor with a dual-gate structure, the first gate terminal of the threshold compensation transistor T3 can be a portion of the scan signal line Ga which is overlapped with the active semiconductor layer 310, and the second gate terminal of the threshold compensation transistor T3 can be a portion, which is overlapped with the active semiconductor layer 310, of a protruding structure P protruding from the scan signal line Ga. As illustrated in FIG. 6, FIG. 8 and FIG. 15, the gate terminal of the driving transistor T1 can be the second terminal CC2 of the capacitor C.

It should be noted that FIG. 15 illustrates the portions of the first conductive layer 320 which are overlapped with the active semiconductor layer 310. For the channel region of each transistor, the active semiconductor layers at both sides of each channel region are conductive by process such as ion doping, etc., to form the first terminal and the second terminal of each transistor.

For example, as illustrated in FIG. 8, the scan signal line Ga, the reset control signal line Rst, and the light-emitting control signal line EM are arranged in the second direction Y. The scan signal line Ga is located between the reset control signal line Rst and the light-emitting control signal line EM.

For example, in the second direction Y, the second terminal CC2 of the capacitor C (i.e., the gate terminal of the driving transistor T1) is located between the scan signal line Ga and the light-emitting control signal line EM. The protruding structure P protruding from the scan signal line Ga is located at a side of the scan signal line Ga away from the light-emitting control signal line EM.

For example, as illustrated in FIG. 7, FIG. 8 and FIG. 15, in the second direction Y, the gate terminal of the data writing transistor T2, the gate terminal of the threshold compensation transistor T3, and the gate terminal of the first reset transistor T6 are all located at a first side of the gate terminal of the driving transistor T1, and the gate terminal of the first light-emitting control transistor T4, the gate terminal of the second light-emitting control transistor T5, and the gate terminal of the second reset transistor T7 are all located at a second side of the gate terminal of the driving transistor T1. For example, in the examples illustrated in FIG. 7, FIG. 8 and FIG. 15, the first side and the second side of the gate terminal of the driving transistor T1 of the pixel circuit of the sub-pixel are opposite sides of the gate terminal of the driving transistor T1 in the second direction Y. For example, as illustrated in FIG. 7 and FIG. 8, in the plane where the first direction X and the second direction Y are located, the first side of the gate terminal of the driving transistor T1 of the pixel circuit of the sub-pixel can be the upper side of the gate terminal of the driving transistor T1, and the second side of the gate terminal of the driving transistor T1 of the pixel circuit of the sub-pixel can be the lower side of the gate terminal of the driving transistor T1. In terms of the lower side, for example, a side of the display panel for bonding integrated circuit (IC) is the lower side of the display panel, and the lower side of the gate terminal of the driving transistor T1 is a side of the gate terminal of the driving transistor T1 closer to the IC. The upper side is an opposite side of the lower side, and for example, the upper side is a side of the gate terminal of the driving transistor T1 farther away from the IC.

For example, in some embodiments, as illustrated in FIG. 7, FIG. 8 and FIG. 15, in the first direction X, the gate terminal of the data writing transistor T2 and the gate terminal of the first light-emitting control transistor T4 are both located at a third side of the gate terminal of the driving transistor T1, and the first gate terminal of the threshold compensation transistor T3, the gate terminal of the second light-emitting control transistor T5, and the gate terminal of the second reset transistor T7 are all located at a fourth side of the gate terminal of the driving transistor T1. For example, as illustrated in FIG. 7, FIG. 8 and FIG. 15, the third side and the fourth side of the gate terminal of the driving transistor T1 of the pixel circuit of the sub-pixel are opposite sides of the gate terminal of the driving transistor T1 in the first direction X. For example, as illustrated in FIG. 7, FIG. 8 and FIG. 15, the third side of the gate terminal of the driving transistor T1 of the pixel circuit can be the right side of the gate terminal of the driving transistor T1 of the pixel circuit, and the fourth side of the gate terminal of the driving transistor T1 of the pixel circuit can be the left side of the gate terminal of the driving transistor T1 of the pixel circuit. The left side and the right side are opposite sides; for example, in terms of the data line Vd and the first power signal line VDD1 that are connected with the same pixel circuit, the data line Vd is at the right side of the first power signal line VDD1, and the first power signal line VDD1 is at the left side of the data line Vd.

It should be noted that the structure of each pixel circuit can be a mirror image structure of that illustrated in FIG. 7 to FIG. 21, that is, each layer structure of each pixel circuit is based on the channel region of the driving transistor T1, and the structures at the left and right sides are reversed, so the above-mentioned relationship between the left side and the right side can be reversed.

For example, a second gate insulating layer (the second gate insulating layer GI2 illustrated in FIG. 22) is formed on the first conductive layer 320 to insulate the first conductive layer 320 from the second conductive layer 330 subsequently formed. FIG. 9 illustrates a second conductive layer 330 of the pixel circuit, and the second conductive layer 330 includes the first terminal CC1 of the capacitor C, the reset power signal line Init, the second power signal line VDD2 and a light shielding portion S. The second power signal line VDD2 and the first terminal CC1 of the capacitor C can be integrated, and a plurality of first power signal lines VDD1 (to be described later) extending in the second direction Y are connected through the second power signal line VDD2 and the first terminal CC1 of the capacitor C, thereby forming a mesh wiring to reduce resistance. The first terminal CC1 of the capacitor C is at least partially overlapped with the second terminal CC2 of the capacitor C to form the capacitor C.

For example, as illustrated in FIG. 9, the active semiconductor layer between the two channels of the dual-gate threshold compensation transistor T3 is in a floating state when the threshold compensation transistor T3 is turned off, which is easily affected by the voltage of surrounding line to cause voltage jump, thus affecting the leakage current of the threshold compensation transistor T3 and further affecting the luminous brightness. In order to keep the voltage of the active semiconductor layer between the two channels of the threshold compensation transistor T3 stable, the light shielding portion S is designed to form a capacitor with the active semiconductor layer between the two channels of the threshold compensation transistor T3, and the light shielding portion S can be connected with the first power signal line VDD1 to obtain a constant voltage, so that the voltage of the active semiconductor layer in the floating state can be kept stable. The light shielding portion S is overlapped with the active semiconductor layer between the two channels of the dual-gate threshold compensation transistor T3, and can also prevent the active semiconductor layer between the two gate terminals from being illuminated to change characteristics thereof, and for example, prevent the voltage of this part of the active semiconductor layer from being changed, so as to avoid crosstalk.

For example, an interlayer insulating layer (the interlayer insulating layer ILD as illustrated in FIG. 22) is formed on the second conductive layer 330 to insulate the second conductive layer 330 from the third conductive layer 340 subsequently formed. FIG. 11 illustrates a third conductive layer 340 of the pixel circuit, and the third conductive layer 340 includes the data line Vd and the first power signal line VDD1. The data line Vd and the first power signal line VDD1 both extend in the second direction Y.

For example, the third conductive layer 340 further includes a first connection element 341, a second connection element 342 and a third connection element 343. FIG. 10 and FIG. 17 also illustrate exemplary positions of a plurality of via holes, and the third conductive layer 340 is connected with a plurality of film layers located between the third conductive layer 340 and the base substrate through the plurality of via holes being illustrated. As illustrated in FIG. 18, the third conductive layer 340 is connected with the active semiconductor layer 310 illustrated in FIG. 7 through via holes, the third conductive layer 340 is connected with the second conductive layer 330 illustrated in FIG. 9 through via holes, and the third conductive layer 340 is connected with the first conductive layer 320 illustrated in FIG. 8 through via holes.

For example, as illustrated in FIG. 7 to FIG. 22, the data line Vd is electrically connected with the second terminal of the data writing transistor T2 through a via hole 381 penetrating the first gate insulating layer GIL the second gate insulating layer GI2, and the interlayer insulating layer ILD. The first power signal line VDD1 is electrically connected with the first terminal of the first light-emitting control transistor T4 through a via hole 382 penetrating the first gate insulating layer GI1, the second gate insulating layer GI2 and the interlayer insulating layer ILD. The first power signal lines VDD1 and the data lines VD are alternately arranged in the first direction. The first power signal line VDD1 is electrically connected with the second power signal line VDD2 (the first terminal CC1 of the storage capacitor) through a via hole 3832 penetrating the interlayer insulating layer ILD. The first power signal line VDD1 extends in the second direction Y, and the second power signal line VDD2 extends in the first direction X. The first power signal line VDD1 and the second power signal line VDD2 are gridded and routed on the display panel. That is to say, the first power signal line VDD1 and the second power signal line VDD2 are arranged in a mesh shape on the entire display panel, so that the resistance of the signal line of the power terminal VDD is small and the voltage drop thereof is low, thereby improving the stability and uniformity of the power voltage provided by the power terminal VDD. The first power signal line VDD1 is electrically connected with the light shielding portion S through a via hole 3833 penetrating the second insulating layer, so as to provide a constant voltage to the light shielding portion S. One end of the first connection element 341 is electrically connected with the second terminal of the threshold compensation transistor T3 through a via hole 384 penetrating the first gate insulating layer GIL the second gate insulating layer GI2 and the interlayer insulating layer ILD, and the other end of the first connection element 341 is electrically connected with the gate terminal of the driving transistor T1 (i.e., the second terminal CC2 of the capacitor C) through a via hole 385 penetrating the second gate insulating layer GI2 and the interlayer insulating layer ILD. One end of the second connection element 342 is electrically connected with the reset power signal line Init through a via hole 386 penetrating the interlayer insulating layer ILD, and the other end of the second connection element 342 is electrically connected with the first terminal of the second reset transistor T7 through a via hole 387 penetrating the first gate insulating layer GI1, the second gate insulating layer GI2, and the interlayer insulating layer ILD. The third connection element 343 is electrically connected with the second terminal of the second light-emitting control transistor T5 through a via hole 352 (i.e., a via hole H2) penetrating the first gate insulating layer GI1, the second gate insulating layer GI2, and the interlayer insulating layer ILD.

For example, a first insulating layer ISL1 is formed on the third conductive layer 340. As illustrated in FIG. 22, the first insulating layer ISL1 can include a passivation layer PVX and a planarization layer PLN, and the first insulating layer ISL1 is used to protect the third conductive layer 340. As illustrated in FIG. 2 and FIG. 22, the first insulating layer ISL1 includes a first via hole H1, and the first electrode of the light-emitting element of each sub-pixel can be disposed at a side of the planarization layer PLN away from the base substrate 100, and the first electrode of the light-emitting element is electrically connected with the third connection element 343 through the first via hole H1, so as to realize electrical connection with the second terminal of the second light-emitting control transistor T5.

For example, as illustrated in FIG. 22, the display panel includes a base substrate 100, a buffer layer BL, a thin film transistor 50 (the second light-emitting control transistor T5 mentioned above), and a storage capacitor C. The thin film transistor 50 includes a second terminal T52 of the second light-emitting control transistor T5 on the base substrate 100, an active layer ATL1 of the driving transistor T1, a first gate insulating layer GI1 at a side of the second terminal T52 of the second light-emitting control transistor T5 and the active layer ATL1 of the driving transistor T1 away from the substrate 100, and a gate terminal GE at a side of the first gate insulating layer GI1 away from the base substrate 100. The gate terminal GE is the gate terminal T10 of the driving transistor T1. The first terminal CC1 of the storage capacitor C has an opening so that the first connection element 341 can be connected with the first terminal of the driving transistor T1 (the second terminal CC2 of the storage capacitor C). The display panel further includes a second gate insulating layer GI2 at a side of the gate terminal GE away from the base substrate 100, an interlayer insulating layer ILD at a side of the second gate insulating layer GI2 away from the base substrate 100, and a third connection element 343 and a first connection element 341 that are located at a side of the interlayer insulating layer ILD away from the base substrate 100. The third connection element 343 is connected with the second terminal T52 through a second via hole H2 penetrating the first gate insulating layer GIL the second gate insulating layer GI2, and the interlayer insulating layer ILD; and the first connection element 341 is connected with the second terminal CC2 of the storage capacitor C. The storage capacitor C includes a first terminal CC1 and a second terminal CC2, the second terminal CC2 and the light-emitting control signal line EM are located in the same layer, and both in the first conductive layer 320; and the first terminal CC1 is located between the second gate insulating layer GI2 and the interlayer insulating layer ILD, and in the second conductive layer 330. The third connection element 343 and the first connection element 341 are located in the third conductive layer 340. The display panel further includes a passivation layer PVX and a planarization layer PLN.

As illustrated in FIG. 22, the display panel further includes a light-emitting element 0220, the light-emitting element 0220 includes a first electrode 231, a light-emitting functional layer 233, and a second electrode 232; and the first electrode 231 is connected with the third connection element 343 (conductive connection element) through a first via hole H1 penetrating the passivation layer PVX and the planarization layer PLN. The light-emitting functional layer 233 at least includes a light-emitting layer, and the light-emitting functional layer 233 can further include at least one selected from the group consisting of a hole injection layer, a hole transport layer, an electron transport layer, an electron injection layer, an electron blocking layer, and a hole blocking layer. The display panel further includes an encapsulation layer CPS, and the encapsulation layer CPS includes a first encapsulation layer CPS1, a second encapsulation layer CPS2, and a third encapsulation layer CPS3. For example, the first encapsulation layer CPS1 and the third encapsulation layer CPS3 are inorganic material layers, and the second encapsulation layer CPS2 is an organic material layer. For example, the first electrode 231 is an anode and the second electrode 232 is a cathode, but the embodiment is not limited to this case.

For example, the light-emitting element 0220 includes an organic light-emitting diode. The light-emitting functional layer is located between the second electrode 232 and the first electrode 231. The light-emitting functional layer 233 at least includes a light-emitting layer, and can further include at least one selected from the group consisting of a hole transport layer, a hole injection layer, an electron transport layer, and an electron injection layer.

As illustrated in FIG. 22, the display panel further includes a pixel definition layer PDL. The pixel definition layer PDL has an opening, and the opening is configured to define a light-emitting area (light exiting region, effective light-emitting area) of the pixel unit; and the display panel can further include a spacer, and the spacer is configured to support a fine metal mask when forming the light-emitting functional layer 233.

For example, in the embodiment of the present disclosure, the first insulating layer ISL1 can include a passivation layer PVX and a planarization layer PLN, and the second insulating layer ISL2 includes at least one selected from the group consisting of a first gate insulating layer GIL a second gate insulating layer GI2, and an interlayer insulating layer ILD.

For example, the buffer layer BL, the passivation layer PVX, the first gate insulating layer GIL the second gate insulating layer GI2, and the interlayer insulating layer ILD are insulating material layers, which include at least one selected from the group consisting of silicon oxide, silicon nitride, and silicon oxynitride, but are not limited thereto. For example, the planarization layer PLN is an insulating material layer, which includes resin, but is not limited thereto.

For example, in the embodiment of the present disclosure, the first conductive layer 320, the second conductive layer 330, and the third conductive layer 340 are all made of conductive materials, and for example, the conductive materials include metal, but are not limited thereto.

For example, in the embodiment of the present disclosure, the first electrode and the second electrode of the light-emitting element are made of conductive materials. For example, the material of the first electrode of the light-emitting element includes conductive metal oxide, such as indium tin oxide, but is not limited thereto. For example, the material of the second electrode of the light-emitting element includes metal, such as silver, but is not limited thereto.

FIG. 22 illustrates a third direction Z, which is perpendicular to the first direction X and perpendicular to the second direction Y. For example, the first direction X and the second direction Y are directions parallel with the surface of the base substrate, and the third direction Z is a direction perpendicular to the surface of the base substrate. The surface of the base substrate is the surface of the base substrate for manufacturing each film layer thereon.

At least one embodiment of the present disclosure further provides a display device, which includes any one of the above display panels.

For example, the display device includes an OLED display device or any product or apparatus including the OLED device and having display function, such as a computer, a mobile phone, a watch, an electronic picture frames and a navigator, etc.

What have been described above are only specific implementations of the present disclosure, and the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be determined based on the protection scope of the claims.

What is claimed is:

1. A display panel, comprising:
    a base substrate;
    a sub-pixel, located on the base substrate, and comprising a pixel circuit and a light-emitting element connected with the pixel circuit, the light-emitting element comprising a first electrode;
    a first insulating layer, located at a side of the pixel circuit away from the base substrate, the first electrode being connected with the pixel circuit through a first via hole penetrating the first insulating layer;
    a pixel definition layer, located at a side of the first electrode away from the base substrate, and comprising an opening,
    wherein the first electrode comprises a main body portion and a connecting portion, the main body portion is connected with the pixel circuit through the connecting portion,
    an orthographic projection of the main body portion on the base substrate is at least partially overlapped with an orthographic projection of the opening on the base substrate, an orthographic projection of the connecting portion on the base substrate is at least partially overlapped with an orthographic projection of the first via hole on the base substrate,
    a size of the connecting portion at the first via hole in a first direction is ⅕ to ⅘ of a size of the main body portion in the first direction,
    wherein a plurality of sub-pixels are provided, the plurality of sub-pixels comprises a plurality of first color sub-pixels, a plurality of second color sub-pixel pairs, and a plurality of third color sub-pixels, and the plurality of first color sub-pixels, the plurality of second color sub-pixel pairs, and the plurality of third color sub-pixels are arranged as a plurality of repeating units,
    each of the plurality of repeating units comprises one first color sub-pixel, one second color sub-pixel pair, and one third color sub-pixel which are sequentially arranged in the first direction, two second color sub-pixels comprised in the second color sub-pixel pair are arranged in a second direction, the plurality of repeating units are arranged in the first direction and the second direction to form a plurality of repeating unit groups, and adjacent repeating unit groups among the plurality of repeating unit groups are staggered with each other in the first direction.

2. The display panel according to claim 1, wherein the size of the connecting portion at the first via hole in the first direction is ⅓ to ¾ of the size of the main body portion in the first direction.

3. The display panel according to claim 2, wherein the size of the connecting portion at the first via hole in the first direction is ½ to ¾ of the size of the main body portion in the first direction.

4. The display panel according to claim 1, wherein a shape of the main body portion of the first electrode is same as a shape of the opening, and an area of the main body portion is greater than an area of the opening, wherein the orthographic projection of the opening on the base substrate completely falls within the orthographic projection of the main body portion on the base substrate, wherein the main body portion and the connecting portion are of an integral structure.

5. The display panel according to claim 1, wherein the second color sub-pixel pair comprises a first sub-pixel and a second sub-pixel, and in one repeating unit, a distance from the first via hole of the first sub-pixel to a line connecting a center of the first via hole of the first color sub-pixel and a center of the first via hole of the third color sub-pixel is less than a distance from the first via hole of the second sub-pixel to the line connecting the center of the first via hole of the first color sub-pixel and the center of the first via hole of the third color sub-pixel, a distance between a portion of the first electrode of the first color sub-pixel at a position of the first via hole and a portion of the first electrode of the first sub-pixel at a position of the first via hole is D1, D1 is less than or equal to 14 μm, and a distance between a portion of the first electrode of the third color sub-pixel at a position of the first via hole and a portion of the first electrode of the first sub-pixel at a position of the first via hole is D2, and D2 is less than or equal to 13 μm, wherein a distance between a portion of the first electrode of the second sub-pixel at a position of the first via hole and a portion, at a position of the first via hole, of the first electrode of the third color sub-pixel in a repeating unit adjacent to the second sub-pixel, is D3, D3 is less than or equal to 12 μm, a distance between a portion of the first electrode of the second sub-pixel at a position of the first via hole and a portion, at a position of the first via hole, of the first electrode of the first color sub-pixel in a repeating unit adjacent to the second sub-pixel, is D4, and D4 is less than or equal to 10 μm.

6. The display panel according to claim 5, wherein D1 is in a range of 13-14 μm, D2 is in a range of 12-13 μm, D3 is in a range of 10.5-12 μm, and D4 is in a range of 8.5-10 μm.

7. The display panel according to claim 1, wherein a distance between a boundary of the first electrode and the first via hole is greater than or equal to 3 μm.

8. The display panel according to claim 1, wherein the second color sub-pixel pair comprises a first sub-pixel and a second sub-pixel, and in one repeating unit, a distance from the first via hole of the first sub-pixel to a line connecting a center of the first via hole of the first color sub-pixel and a center of the first via hole of the third color sub-pixel is less than a distance from the first via hole of the second sub-pixel to the line connecting the center of the first via hole of the first color sub-pixel and the center of the first via hole of the third color sub-pixel, a distance between a portion of the first electrode of the first color sub-pixel at a position of the first via hole and a portion of the first electrode of the first sub-pixel at a position of the first via hole is D1, a distance between a portion of the first electrode of the third color sub-pixel at a position of the first via hole and a portion of the first electrode of the first sub-pixel at a position of the first via hole is D2, a distance between a portion of the first electrode of the second sub-pixel at a position of the first via hole and a portion, at a position of the first via hole, of the first electrode of the third color sub-pixel in a repeating unit adjacent to the second sub-pixel, is D3, a distance between a portion of the first electrode of the second sub-pixel at a position of the first via hole and a portion, at a position of the first via hole, of the first electrode of the first color sub-pixel in a repeating unit adjacent to the second sub-pixel, is D4, D1 is greater than D2, and D3 is greater than D4; or wherein the second color sub-pixel pair comprises a first sub-pixel and a second sub-pixel, and in one repeating unit, a distance from the first via hole of the first sub-pixel to a line connecting a center of the first via hole of the first color sub-pixel and a center of the first via hole of the third color sub-pixel is less than a distance from the first via hole of the second sub-pixel to the line connecting the center of the first via hole of the first color sub-pixel and the center of the first via hole of the third color sub-pixel, a distance between a portion of the first electrode of the first color sub-pixel at a position of the first via hole and a portion of the first electrode of the first sub-pixel at a position of the first via hole is D1, a distance between a portion of the first electrode of the third color sub-pixel at a position of the first via hole and a portion of the first electrode of the first sub-pixel at a position of the first via hole is D2, D1 is greater than a size of the connecting portion of the first sub-pixel at the first via hole in the first direction, and the size of the connecting portion of the first sub-pixel at the first via hole in the first direction is greater than D2; or wherein the second color sub-pixel pair comprises a first sub-pixel and a second sub-pixel, and in one repeating unit, a distance from the first via hole of the first sub-pixel to a line connecting a center of the first via hole of the first color sub-pixel and a center of the first via hole of the third color sub-pixel is less than a distance from the first via hole of the second sub-pixel to the line connecting the center of the first via hole of the first color sub-pixel and the center of the first via hole of the third color sub-pixel, a distance between a portion of the first electrode of the second sub-pixel at a position of the first via hole and a portion, at a position of the first via hole, of the first electrode of the third color sub-pixel in a repeating unit adjacent to the second sub-pixel, is D3, a distance between a portion of the first electrode of the second sub-pixel at a position of the first via hole and a portion, at a position of the first via hole, of the first electrode of the first color sub-pixel in a repeating unit adjacent to the second sub-pixel, is D4, a size of the connecting portion of the second sub-pixel at the first via hole in the first direction is greater than D3, and D3 is greater than D4; or wherein the second color sub-pixel pair comprises a first sub-pixel and a second sub-pixel, and in one repeating unit, a distance from the first via hole of the first sub-pixel to a line connecting a center of the first via hole of the first color sub-pixel and a center of the first via hole of the third color sub-pixel is less than a distance from the first via hole of the second sub-pixel to the line connecting the center of the first via hole of the first color sub-pixel and the center of the first via hole of the third color sub-pixel, a distance between a portion of the first electrode of the first color sub-pixel at a position of the first via hole and a portion of the first electrode of the first sub-pixel at a position of the first via hole is D1, a distance between a portion of the first electrode of the third color sub-pixel at a position of the first via hole and a portion of the first electrode of the first sub-pixel at a position of the first via hole is D2, and a sum of D1, a size of the connecting portion of the first sub-pixel at the first via hole in the first direction, and D2, is greater than a size of the main body portion of the first sub-pixel in the first direction; or wherein the second color sub-pixel pair comprises a first sub-pixel and a second sub-pixel, and in one repeating unit, a distance from the first via hole of the first sub-pixel to a line connecting a center of the first via hole of the first color sub-pixel and a center of the first via hole of the third color sub-pixel is less than a distance from the first via hole of the second sub-pixel to the line connecting the center of the first via hole of the first color sub-pixel and the center of the first via hole of the third color sub-pixel, a distance between a portion of the first electrode of the second sub-pixel at a position of the first via hole and a portion, at a position of the first via hole, of the first electrode of the third color sub-pixel in a repeating unit adjacent to the second sub-pixel, is D3, a distance between a portion of the first electrode of the second sub-pixel at a position of the first via hole and a portion, at a position of the first via hole, of the first electrode of the first color sub-pixel in a repeating unit adjacent to the second sub-pixel, is D4, and a sum of D3, a size of the connecting portion of the second sub-pixel at the first via hole in the first direction, and D4, is greater than a size of the main body portion of the second sub-pixel in the first direction.

9. The display panel according to claim 1, wherein the connecting portion has a connecting sub-portion located between the opening and the first via hole, and an average size of the connecting sub-portion in the first direction is greater than a maximum size of the opening in the first direction,
wherein a minimum size of the connecting sub-portion in the first direction is greater than the maximum size of the opening in the first direction.

10. The display panel according to claim 9, wherein in the repeating unit, the connecting sub-portion of the first color sub-pixel is bent toward the second color sub-pixel pair with respect to the main body portion of the first color sub-pixel, and the connecting sub-portion of the third color sub-pixel is bent toward the second color sub-pixel pair with respect to the main body portion of the third color sub-pixel,
the connecting sub-portion of the first color sub-pixel at least comprises a size-gradual-change part, the size-gradual-change part of the first color sub-pixel is located between an edge of the connecting sub-portion of the first color sub-pixel away from the second color sub-pixel pair and the opening of the first color sub-pixel, and a size of the size-gradual-change part of the first color sub-pixel in a direction perpendicular to an extending direction of the size-gradual-change part of the first color sub-pixel gradually changes, and
the connecting sub-portion of the third color sub-pixel at least comprises a size-gradual-change part, the size-gradual-change part of the third color sub-pixel is located between an edge of the connecting sub-portion of the third color sub-pixel away from the second color sub-pixel pair and the opening of the third color sub-pixel, and a size of the size-gradual-change part of the third color sub-pixel in a direction perpendicular to an extending direction of the size-gradual-change part of the third color sub-pixel gradually changes.

11. The display panel according to claim 10, wherein a size of the size-gradual-change part gradually increases in a direction from a position away from the first via hole to a position close to the first via hole.

12. The display panel according to claim 9, wherein the connecting sub-portion has a first edge and a second edge which are opposite to each other, an included angle between the first edge and the second edge of the first electrode of the first color sub-pixel is greater than 0 and less than or equal to 17°, and an included angle between the first edge and the second edge of the first electrode of the third color sub-pixel is greater than 0 and less than or equal to 15°.

13. The display panel according to claim 12, wherein an included angle between the first edge and the second edge of the first electrode of one of the two second color sub-pixels is greater than or equal to 0 and less than or equal to 60°, and an included angle between the first edge and the second edge of the first electrode of the other of the two second color sub-pixels is greater than or equal to 5° and less than or equal to 60°.

14. The display panel according to claim 9, wherein in the first color sub-pixel, a size of the first via hole in the first direction is 40%-60% of a size of the opening in the first direction; in the second color sub-pixel, a size of the first via hole in the first direction is 30%-50% of a size of the opening in the first direction; and in the third color sub-pixel, a size of the first via hole in the first direction is 30%-50% of a size of the opening in the first direction.

15. The display panel according to claim 9, wherein the first color sub-pixel is a red sub-pixel, the second color sub-pixel is a green sub-pixel, and the third color sub-pixel is a blue sub-pixel.

16. The display panel according to claim 9, wherein the connecting sub-portion has a first edge and a second edge which are opposite to each other, the main body portion has a first side and a second side which are opposite to each other and parallel with each other, the first side is connected with the first edge, and the second side is connected with the second edge,
a length of a line connecting a midpoint of the first edge and a midpoint of an edge of the opening closest to the first edge is greater than 5 μm, and a length of a line connecting a midpoint of the second edge and a midpoint of an edge of the opening closest to the second edge is greater than 5 μm.

17. The display panel according to claim 1, wherein a size of the first via hole in the first direction is greater than a size of the first via hole in the second direction.

18. The display panel according to claim 1, further comprising a second insulating layer located at a side of the pixel circuit away from the base substrate and a conductive connection element located at a side of the second insulating layer away from the base substrate, wherein the conductive connection element is connected with the pixel circuit through a second via hole penetrating the second insulating layer, and the first electrode is connected with the pixel circuit through the conductive connection element.

19. A display device, comprising the display panel according to claim 1.

* * * * *